United States Patent
Ohmi et al.

(10) Patent No.: US 8,357,267 B2
(45) Date of Patent: Jan. 22, 2013

(54) FILM PRODUCING METHOD USING ATMOSPHERIC PRESSURE HYDROGEN PLASMA, AND METHOD AND APPARATUS FOR PRODUCING REFINED FILM

(75) Inventors: Hiromasa Ohmi, Mino (JP); Kiyoshi Yasutake, Ikeda (JP); Hiroaki Kakiuchi, Suita (JP)

(73) Assignee: Sharp Kabushiki Kaisha, Osaka (JP)

( * ) Notice: Subject to any disclaimer, the term of this patent is extended or adjusted under 35 U.S.C. 154(b) by 1219 days.

(21) Appl. No.: 12/084,137

(22) PCT Filed: Sep. 8, 2006

(86) PCT No.: PCT/JP2006/317817
§ 371 (c)(1),
(2), (4) Date: Jul. 21, 2008

(87) PCT Pub. No.: WO2007/049402
PCT Pub. Date: May 3, 2007

(65) Prior Publication Data
US 2009/0301864 A1 Dec. 10, 2009

(30) Foreign Application Priority Data
Oct. 26, 2005 (JP) .................................. 2005-311934

(51) Int. Cl.
*C23C 14/34* (2006.01)
(52) U.S. Cl. ......... 204/192.15; 204/192.12; 204/192.22; 204/192.23; 204/298.07; 204/298.09; 204/298.12
(58) Field of Classification Search ............. 204/192.12, 204/192.15, 192.22, 192.23, 298.07, 298.09, 204/298.12
See application file for complete search history.

(56) References Cited

U.S. PATENT DOCUMENTS 4,414,069 A * 11/1983 Cuomo .................... 204/192.34
5,593,551 A * 1/1997 Lai ........................... 204/192.12

FOREIGN PATENT DOCUMENTS

JP  A-58-033830  2/1983

(Continued)

OTHER PUBLICATIONS

Jun. 14, 2010 extended European Search Report issued in corresponding European Patent Application No. 06 797 672.0.

(Continued)

*Primary Examiner* — Keith Hendricks
*Assistant Examiner* — Jason M Berman
(74) *Attorney, Agent, or Firm* — Oliff & Berridge, PLC

(57) ABSTRACT

The present invention has been achieved to provide a method and apparatus for speedily and homogeneously fabricating polycrystalline silicon films or similar devices at low cost. A silicon target is attached to a water-cooled electrode, while a substrate made of a desired material is set on the other, heated electrode. When atmospheric pressure hydrogen plasma is generated between the two electrodes, silicon atoms will be released from the low-temperature target on the side and deposited on the high-temperature substrate. A doped silicon film can be created by using a target containing a doping element. Since there is no need to handle expensive and harmful gases (e.g. $SiH_4$, $B_2H_6$ and $PH_3$), the apparatus can be installed and operated at lower costs. In an application of the film producing method according to the present invention, an objective substance can be selectively purified from a target containing a plurality of substances.

20 Claims, 26 Drawing Sheets

FOREIGN PATENT DOCUMENTS

| | | |
|---|---|---|
| JP | A-61-014102 | 1/1986 |
| JP | A-63-111173 | 5/1988 |
| JP | A-01-308018 | 12/1989 |
| JP | A-05-078837 | 3/1993 |
| JP | A-10-340797 | 12/1998 |
| JP | A-2002-270519 | 9/2002 |
| JP | B2-3348259 | 9/2002 |
| JP | A-2002-324795 | 11/2002 |
| JP | A-2003-229299 | 8/2003 |
| JP | A-2004-165145 | 6/2004 |
| JP | A-2004-311983 | 11/2004 |
| JP | A-2005-154878 | 6/2005 |

OTHER PUBLICATIONS

Sun et al., "Characterization of 3C-SiC Films Grown on Monocrystalline Si by Reactive Hydrogen Plasma Sputtering," *J. Appl. Phys.*, Sep. 1997, pp. 2334-2341, vol. 82, No. 5, American Institute of Physics.

Asamaki, Tatsuo, "Essentials of Thin Film Production," *The Nikkan Kogyo Shinbun, Ltd.*, pp. 234-273, Jul. 2005.

* cited by examiner

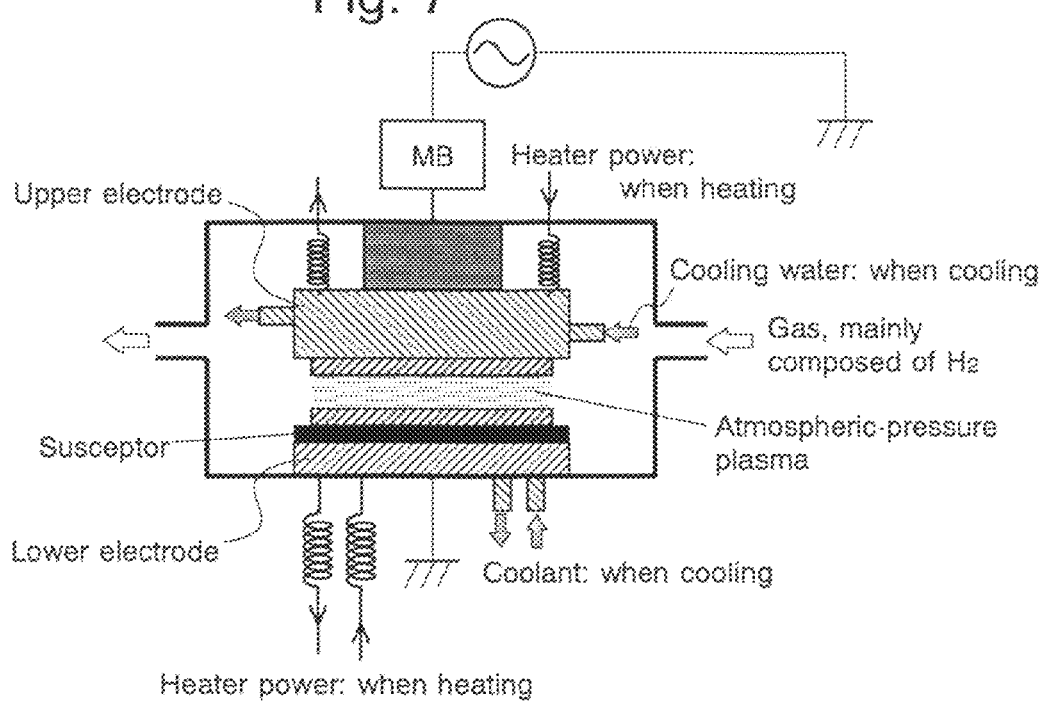
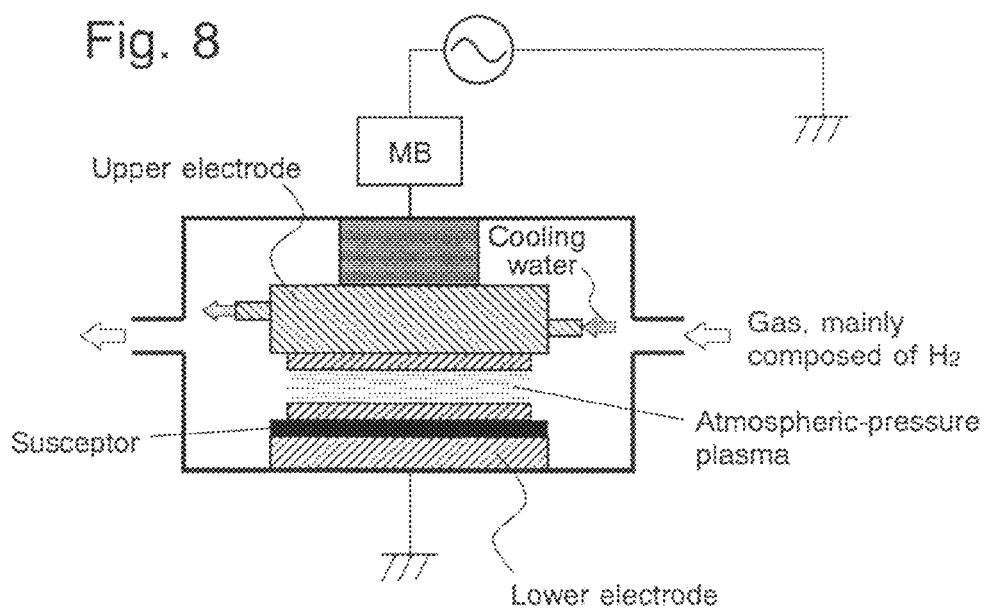

(a)  (b)  (c)

(a)　　　　　　　　(b)　　　　　　　　(c)

MG-Si = Metallurgical grade silicon

| | General MG-Si (ppm mass) | MG-Si used (ppm mass) | Solar grade Si (ppm mass) |
|---|---|---|---|
| Fe | 1500-6000 | 6900 | <0.007 |
| Al | 1000-4000 | 590 | <0.06 |
| Ti | 120-275 | 150 | $<4 \times 10^{-5}$ |
| Cu | 15-40 | 5.52 | <2.5 |
| Cr | 40-220 | 2.12 | $<4 \times 10^{-3}$ |
| Mn | 10-80 | 417 | <0.007 |
| Ni | 10-95 | 300 | <0.1 |
| Ge | 300 | 192 | - |
| Co | 2 | 3.29 | <0.008 |
| V | 50-250 | <0.1 | $<4 \times 10^{-5}$ |
| Zr | 15-25 | <0.1 | $<2 \times 10^{-5}$ |
| C | 1000-3000 | ? | <3 |
| B | 40-60 | ? | <0.1-0.3 |
| P | 20-45 | ? | <0.1 |

FILM PRODUCING METHOD USING ATMOSPHERIC PRESSURE HYDROGEN PLASMA, AND METHOD AND APPARATUS FOR PRODUCING REFINED FILM

TECHNICAL FIELD

The present invention relates to methods and apparatuses for speedily and homogeneously producing various kinds of functional material films, including polycrystalline silicon films, at low cost.

BACKGROUND ART

In recent years, there have been growing demands for speedy and homogeneous production of functional thin films in various industries. One of the important challenges has been to establish a method for efficiently creating high-performance polycrystalline silicon films at low cost. Such films are expected to be practically used in the fields of "giant electronics", such as thin film solar cells or liquid crystal thin film transistors (TFTs).

Compared with amorphous silicon used in conventional thin film solar cells or liquid crystal TFTs, polycrystalline silicon has many advantageous properties. For example, it is higher in carrier mobility, longer in carrier lifetime and free from light degradation. However, if a polycrystalline silicon film is to be used in a solar cell, it is necessary to make the film ten times as thick as the conventional ones, or even thicker, since its absorption coefficient for sunlight is smaller than that of amorphous silicon.

Conventionally, such polycrystalline silicon films are formed by chemical vapor deposition (CVD), in which a silicon-based material gas (e.g. $SiH_4$ or $SiF_4$) is decomposed by heat, plasma or the like to form the film (refer to Patent Documents 1 and 2 and Non-Patent Document 1).

[Patent Document 1] Japanese Unexamined Patent Application Publication No. 2002-270519

[Patent Document 2] Japanese Unexamined Patent Application Publication No. H08-008180

[Non-Patent Document 1] Tatsuo ASAMAKI, "Hakumaku Sakusei No Kiso" (Essentials of Thin Film Production), THE NIKKAN KOGYO SHINBUN, LTD., July 2005, pp. 234-273

DISCLOSURE OF THE INVENTION

Problem to be Solved by the Invention

Though widely used thus far, the CVD methods for fabricating silicon films are accompanied by the following problems:

Firstly, the silicon-based material gases (e.g. $SiH_4$ and $SiF_4$) used in the CVD methods are expensive, flammable and toxic, so that a complex gas-treating equipment is required. This increases the installation and operating costs of the system. Furthermore, the usage efficiency of the material gas by CVD methods is currently approx. 20% at its highest. This means that most of the expensive gas is wasted. Equipment for removing fine particles is also necessary to prevent a vacuum pump or other component from burning due to particles resulting from condensation of an imperfectly reacted gas. The addition of this equipment also increases the total cost of the system.

The second problem exists in that CVD methods include a doping process for controlling the resistivity of silicon film or for other purposes and this process uses a strongly toxic, expensive doping gas, such as phosphine ($PH_3$), biborane ($B_2H_6$), arsine ($AsH_3$) or stibine ($SbH_3$). Use of such toxic gases further increases the cost of the toxic-gas-treating equipment.

A sputtering technique using a low-pressure plasma is another conventional method, which does not use any gas material. Unfortunately, this technique is slow in deposition rate and inefficient in using the target.

Accordingly, an objective of the present invention is to provide a new film producing method that can overcome the problems explained thus far.

The present invention also provides a film producing method capable of selectively extracting an objective substance to be refined from a target that contains the objective substance with impurities, and then highly purifying the extracted substance and forming a film.

Means for Solving the Problems

To solve the aforementioned problems, a film producing method according to the present invention includes:

arranging a substrate and a target parallel to each other within a reaction chamber filled with a reactant gas mainly composed of hydrogen at a pressure of 10 to 202 kPa (76 to 1520 Torr), the target being made of a substance whose hydride is volatile, the substrate being maintained at a relatively high temperature and the target at a relatively low temperature; and generating an electric discharge between the substrate and the target to form a thin film of the target on the substrate.

The present invention is based on the following principle: Under the condition that a target made of a substance whose hydride is volatile is positioned parallel to a substrate and a temperature difference is provided between them, when a hydrogen plasma of approximately atmospheric pressure is generated between these two plate-shaped objects, the following two processes simultaneously take place on their surfaces: (1) Etching process, in which the target material M chemically reacts with atomic hydrogen produced by the hydrogen plasma and volatiles in the form of a hydride $MH_x$ ($x=1, 2, \ldots$), and (2) Deposition process, in which the hydride produced by the etching is re-decomposed within the plasma, causing deposition of the target material M. On the surface of the target on the low temperature side, the etching rate in (1) is higher than the deposition rate in (2). Conversely, on the surface of the substrate on the high temperature side, the deposition rate in (2) is higher than the etching rate in (1). Providing an appropriately large temperature difference between the two objects leads to a significantly large difference between the etching rate and the deposition rate, causing a relatively high-speed mass transfer from the target on the low temperature side to the substrate on the high temperature side.

This phenomenon occurs irrespective of whether the constituents of the target are identical to or different from those of the substrate; the material of the substrate does not matter here, and neither does the method of plasma generation. After the process is continued for some time, the surface of the substrate will be covered with the target material. After this state is achieved, the mass transfer takes place through the plasma, only due to the temperature difference of the same substance (of the target material).

The target may be made of any material as long as its hydride is volatile. Therefore, a doping element may be mixed into the target before the deposition process. This operation enables the production of doped films without using a doping gas. Two or more kinds of targets made of different substances may be arranged parallel to the substrate, whereby a film made of a mixture of those substances can be formed on the substrate. In this case, it is preferable to periodically move the targets so that the substances will be uniformly distributed over the film.

An industrially important application of such a phenomenon using a hydrogen gas plasma is the case where the target is mainly composed of silicon. In this case, the present technique makes it possible to form polycrystalline silicon films using stable solid materials and hydrogen only; there is no need to use an expensive, toxic, self-burning material gas (e.g. $SiH_4$) or doping gas. This means that the method according to the present invention is suitable for the production of high-performance polycrystalline silicon films usable in solar cells or liquid crystal displays.

The method according to the present invention is applicable to any substance that can be hydrogenated and whose hydride is volatile. Examples of such substances are SiC, C, Ge, Sn, Ga, B, P, Sb and As in addition to Si.

In the method according to the present invention, a doped film can be created by mixing an impurity into the target material beforehand.

In the method according to the present invention, the reactant gas may be a mixed gas obtained by adding a rare gas to a hydrogen gas having a pressure of 10 to 202 kPa (76 to 1520 Torr).

A method for fabricating a refined film according to the present invention is a refining method for purifying and extracting an objective substance to be refined from a target containing one or more impurities, the target being made of a substance whose hydride is volatile, and the method includes:

arranging a substrate and the target parallel to each other within a reaction chamber filled with a reactant gas mainly composed of hydrogen at a pressure of 10 to 202 kPa (76 to 1520 Torr);

controlling the temperature of the substrate and that of the target taking into account the temperature-etching rate characteristic of each substance contained in the target so that the etching rate of the objective substance at the temperature of the target is higher than that at the temperature of the substrate, while the etching rate of each of the impurities at the temperature of the substrate is higher than that at the temperature of the target, or while the etching rate of each of the impurities at the temperature of the target is lower than the etching rate of the objective substance at the temperature of the target; and generating an electric discharge between the substrate and the target to form a thin film of the objective substance on the substrate.

To achieve higher degrees of purity of the objective substance in the film produced by the previously described method for fabricating a refined film, it is preferable to create a film on the substrate by setting a previously obtained film as a new target and repeating the previously described refining method.

Effects of the Invention

The present invention uses only a gas mainly composed of hydrogen, a harmless and inexpensive substance; the method does not use harmful, expensive film-fabricating gases, such as $SiH_4$ which was conventionally used in the production of silicon films. Use of this harmless and inexpensive gas enables the cost reduction of the relevant equipment.

Furthermore, the present invention significantly improves the usage efficiency of the source material; it can be approximately 90% or even higher. The use of hydrogen plasma having a relatively high pressure in the present invention enables the deposition rate to be higher than in the conventional low-pressure sputtering method. The volatilization of the target is caused by a chemical reaction of the hydrogen plasma at approximately atmospheric pressure. Therefore, compared with the conventional CVD technique using a low-pressure plasma, the energy of charged particles striking the substrate is reduced, so that the resulting film undergoes less physical damage. Thus, the method according to the present invention can create a defect-free, high-quality film.

In the method according to the present invention, a doped film can be obtained by mixing an impurity into the target material beforehand. Since there is no need to use a harmful, expensive doping gas, it is possible to simplify the configuration of the entire apparatus including the gas supplying and treating system, reducing the installation and operation cost of the apparatus.

The present invention also enables the creation of a film in which different materials originating from a plurality of target materials are mixed with or laminated on each other. Thus, a complex functional film can be easily created.

Having various characteristics described thus far, the method according to the present invention is suitable for the production of silicon-based films used in solar cells or flat panel display devices.

The reactant gas may be a mixed gas prepared by adding a rare gas to a hydrogen gas having a pressure of 10 to 202 kPa (76 to 1520 Torr), whereby the resulting films can be structurally modulated.

Similar to the previous method, the refined film producing method according to the present invention is advantageous in that it does not use harmful, expensive film-fabricating gases but uses only a harmless and inexpensive gas mainly composed of hydrogen.

Another advantage of the refined film producing method according to the present invention will be remarkable in the production of silicon solar cells. Currently, silicon solar cells are mostly produced using sub-standard products of silicon wafers originally produced for LSIs. The silicon for LSI production needs to have a purity level of 99.999999999% or higher. This level is much higher than that required for solar cell production, in which the purity of the silicon may be as low as 99.9999%. Thus, it can be said that solar cells are currently produced using excessively high-quality silicon materials. This should be regarded as wasteful of energy and money, even if sub-standard or low-quality silicon products are used. The current situation is also undesirable for solar cell production in that the supply and price of silicon are too strongly dependent on the LSI industry. These problems can be solved by the refined film producing method according to the present invention, in which a solar-grade silicon can be directly created from a low-quality silicon having a purity of 98 to 99%. This will significantly reduce the time, energy and costs. The method will also enable solar cell production to be independent of the LSI industry and enjoy a stable supply of materials.

BRIEF DESCRIPTION OF THE DRAWINGS

FIG. 7 is a schematic structural diagram of a refined film producing apparatus as an embodiment of the present invention.

FIG. 8 is a schematic structural diagram of a film producing apparatus as an embodiment of the present invention.

FIG. 18(a) corresponds to the case where the power density was maintained constant relative to the plasma volume and FIG. 18(b) corresponds to the case where the power was maintained constant.

BEST MODE FOR CARRYING OUT THE INVENTION

Figure 1:
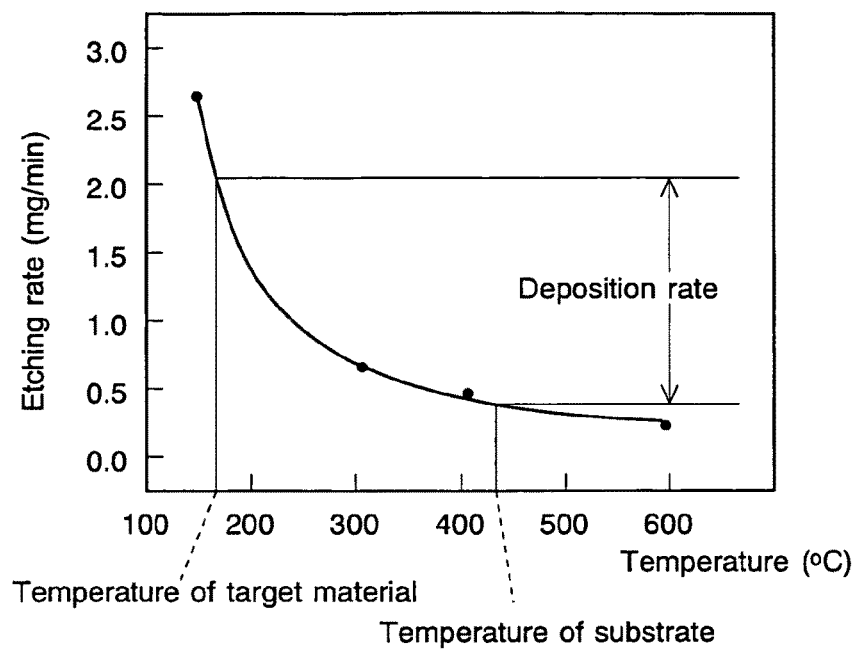
FIG. 1 is a graph of an etching rate of a single-crystalline silicon (001) by an atmospheric pressure hydrogen plasma.

Firstly, an experiment was carried out as follows: An upper electrode made of stainless steel coated with sprayed alumina and a lower electrode on which a susceptor for heating was attached were arranged within a reaction chamber. A target made of a single-crystalline silicon (001)-plate having an area of 35 cm$^2$ was placed on the susceptor. Then, the distance between the surface of the upper electrode and that of the target was reduced to 1 mm. Subsequently, a pure hydrogen gas was introduced into the reaction chamber until a pressure of 26.6 kPa (200 Torr) was reached, after which a radio-frequency power of 2.5 kW at a frequency of 150 MHz was applied to the upper electrode. Under these conditions, the etching rate of the single-crystalline silicon (100)-substrate placed on the lower electrode was measured while the temperature of the target was varied from 150° to 600° C. using the susceptor. An etching rate is defined as the mass decrease of the silicon on the lower substrate divided by the reaction time. FIG. 1 shows the measured result. This figure shows that the etching rate exponentially decreases with the increase in silicon temperature. This phenomenon can be described by the following equation:

$$Q_{etching} = Q_{e0} \exp(-E_a/kT),$$

where $Q_{etching}$ is the etching rate, $E_a$ is the activation energy of the system, $Q_{e0}$ is the frequency factor in the etching reaction, k is the Boltzmann factor, and T is the absolute temperature. Under the present experimental conditions, $E_a$ equals −150 meV. The reason why the activation energy took a negative value is most likely because the desorption of hydrogen from the silicon surface is a thermal activation process and the etching action observed in the experiment is caused by the hydrogen adsorbed on the silicon surface.

Generally, a silicon-etching process is said to be caused by hydrogen adsorbed on the silicon surface; the hydrogen atoms loosen the back bonds of the outermost silicon atoms and penetrate into the loosened bonds. As the silicon temperature rises, it will be impossible for those hydrogen atoms to stay on the surface of the silicon for a long enough period of time for them to penetrate into the loosened back bonds. This is the probable reason for the decrease in etching rate.

The previous result shows that a film can be deposited onto a silicon substrate by arranging the substrate parallel to a silicon target and providing an appropriate temperature difference between them, the target being on the low temperature side and the substrate on the high temperature side. Ideally, the deposition quantity on the silicon substrate is given by:

$$\begin{aligned} Q_{deposition} &= Q_{e0}\exp(-E_a/kT_{tgt}) - Q_{e0}\exp(-E_a/kT_{sub}) \\ &= Q_{e0}\{\exp(-E_a/kT_{tgt}) - \exp(-E_a/kT_{sub})\}, \end{aligned}$$

where $Q_{deposition}$ is the deposition rate, $T_{tgt}$ is the temperature of the silicon target, and $T_{sub}$ is the temperature of the silicon substrate.

Figure 2:
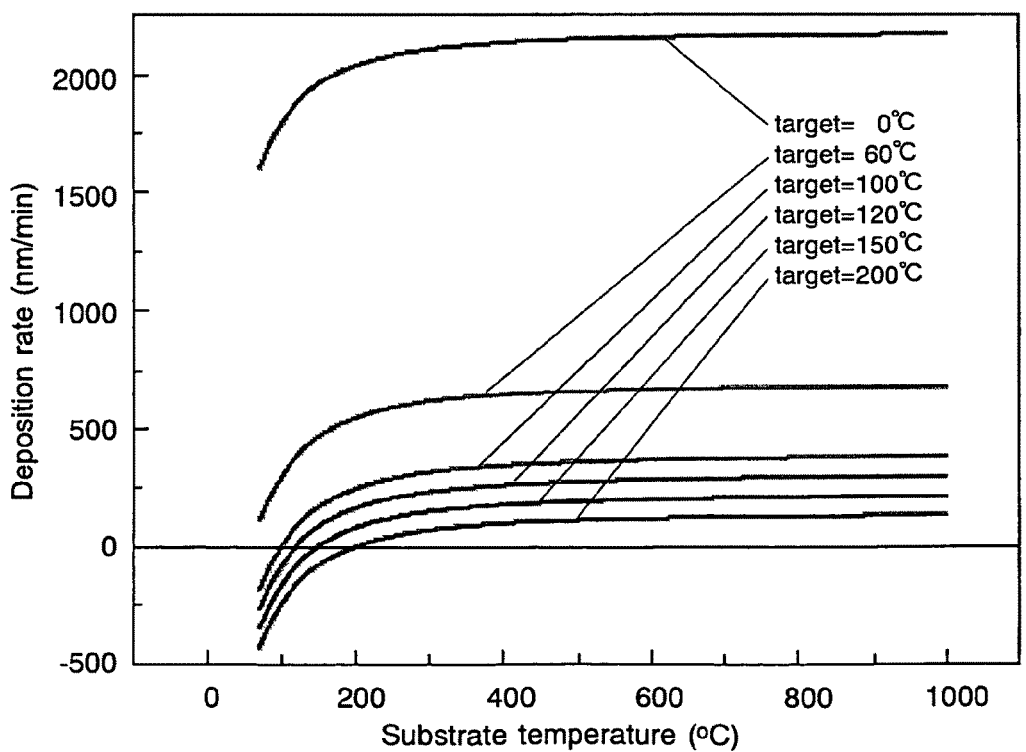
FIG. 2 is a graph showing a relationship between the substrate temperature and the deposition rate with the temperature of the target as a parameter.

A relationship between the substrate temperature and the deposition rate with the temperature of the target as the parameter is shown in FIG. 2. Using this figure and the previous equation, it is possible to determine the deposition rate. For example, if the temperature of the silicon target is 60° C. and that of the silicon substrate is 500° C., the deposition rate of silicon film on the substrate will be 600 nm/min. Further lowering the target temperature will enable the deposition of silicon film at a rate several ten times that in the conventional low-pressure plasma CVD or even higher.

In a low-pressure plasma, the mean free path is generally long since the gas density is low. Therefore, to stabilize the plasma, the target-substrate distance needs to be several centimeters. The low-level of the gas concentration also suggests that the number of atomic atoms contributing to the etching is small.

By contrast, in a relatively high-pressure plasma such as used in the present invention, the mean free path is short since the gas density is high. Therefore, to stabilize the plasma, the target-substrate distance needs to be several millimeters or smaller.

This difference in the target-substrate distance significantly affects the phenomenon of diffusion, which helps the transport of the material gas. The diffusion equation of a substance can be expressed as:

$$J = -D(\partial N/\partial x) \text{ and}$$

$$\partial N/\partial t = D\partial^2 N/\partial x^2,$$

where J is the flux of the substance, D is the diffusion coefficient, N is the concentration and x is the position.

In a steady state, N does not change with time and so the second equation is negligible. The first equation indicates that the material gas moves faster toward the substrate as the concentration gradient is larger.

If the concentration of the gas material on the substrate surface is zero and that on the target surface equals the generated amount of the gas, the concentration gradient between the target and the substrate is inversely proportional to their distance. The amount of material gas generated on the target surface depends on the plasma pressure. Therefore, by reducing the target-substrate distance and using atmospheric pressure plasma, it is possible to obtain a concentration gradient equal to or larger than ten times that in the conventional cases, where the distance is larger and the plasma pressure is lower. As a result, the material substance will be transferred faster. This is the major effect of the present invention.

A material usage efficiency can be calculated from the weight of the film deposited on the substrate and the etched amount. The material usage efficiency of the present method was equal to or higher than 90% in most cases, although it varied depending on the substrate temperature and the target-substrate distance. By contrast, the material usage efficiency of normal CVD methods is approximately 20% at its highest. Thus, the material usage efficiency of the present method has been proven to be excellent. This is most likely because, in the atmospheric pressure plasma of the present study, material atoms emitted from the target can rarely escape to the space outside the substrate because the distance between the target substrate is reduced to stabilize the plasma.

Figure 3:
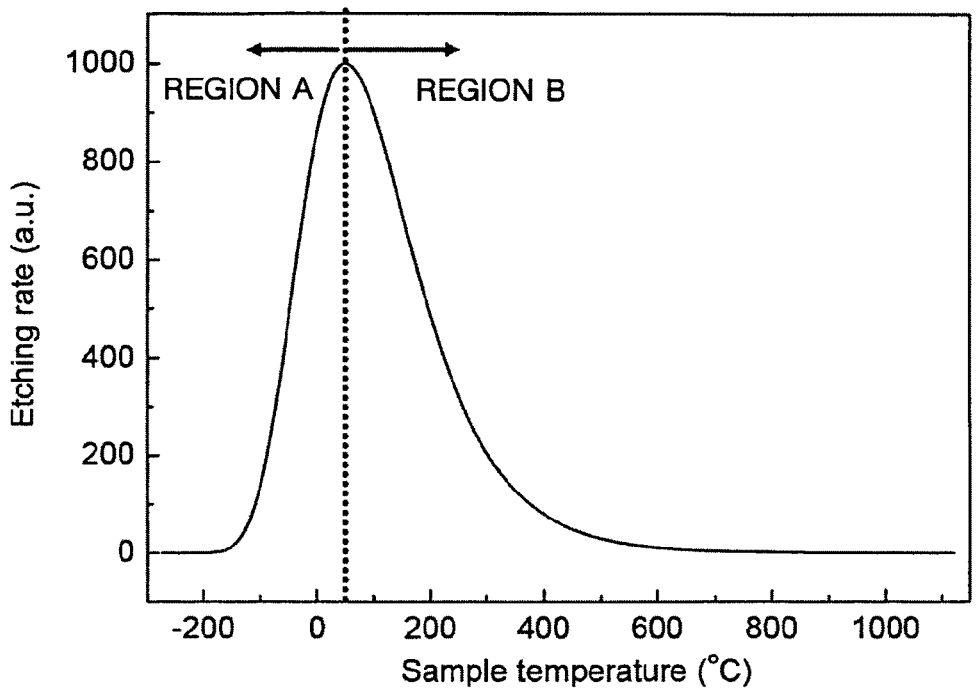
FIG. 3 is a graph showing a relationship between the sample temperature and the etching rate in the case of etching a substance A, which can be hydrogenated, by an atmospheric pressure hydrogen plasma.

Next, the refined film producing method according to the present invention is described. Its principle is as follows: In the case where a substance A, which can be hydrogenated, is etched by an atmospheric pressure hydrogen plasma, the etching characteristics with respect to the sample temperature will be similar to the graph shown in FIG. 3. Within the region A, the etching rate is governed by the activation energy necessary for evaporating the produced hydride ($E_{evap}$). Within the region B, the etching rate decreases because the hydrogen adsorbed on the surface of the substance A becomes thermally desorbed as the temperature rises. Therefore, within the region B, the etching rate is apparently governed by negative activation energy ($E_{des}$). The hydrogen-plasma etching reaction ($R_{etch}$) of a substance that can be hydrogenated can be regarded as being governed by the following equation:

$$R_{etch} = Q_{evap} \exp(-E_{evap}/kT) + Q_{des} \exp(-E^{des}/kT),$$

where $Q_{evap}$ and $Q_{des}$ are frequency factors in the respective reactions.

Figure 4:
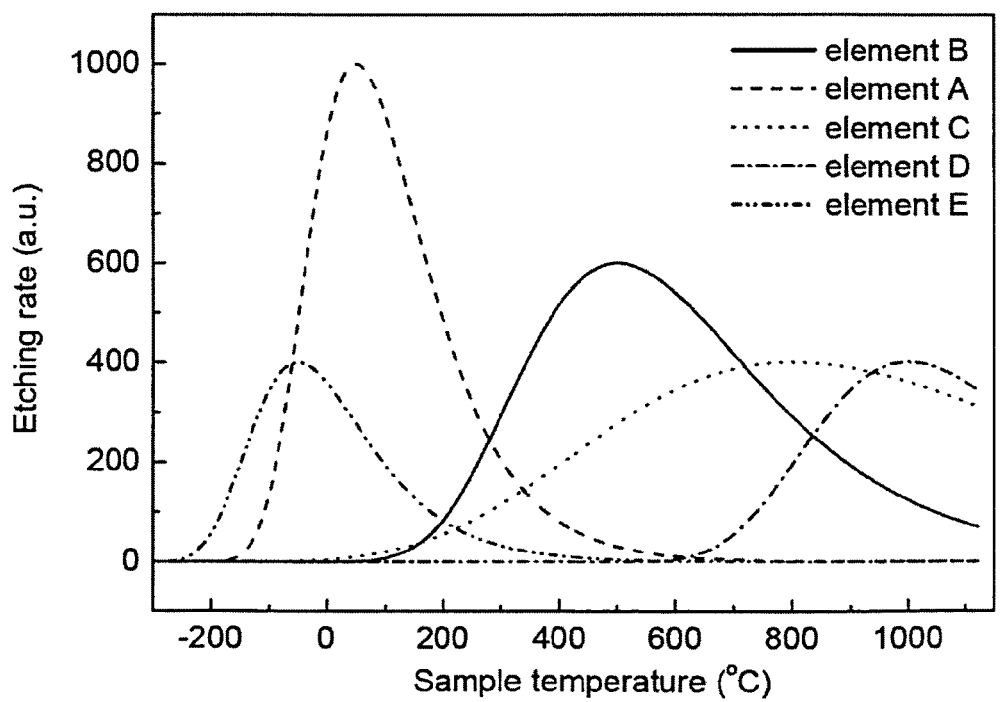
FIG. 4 is a graph showing a relationship between the sample temperature of a plurality of elements and the etching rate.

$E_{evap}$, $E_{des}$, $Q_{evap}$ and $Q_{des}$ in the previous equation are inherent values decided by the choice of substances and the reaction system used (e.g. the conditions of plasma generation). Suppose that a solid A (objective substance) containing elements B, C, D and E is exposed to a hydrogen plasma. In this case, the etching rate of each substance by the hydrogen plasma will show different etching characteristics, as shown in FIG. 4, according to the difference in their activation energy. In the present case, if the temperature of solid A is set at 100° C., the ratio of etching rates of those elements will be A:B:C:D:E=900:7:20:8×10$^{-35}$:194. The quantities of B, C and D-hydrides produced by the etching of the material A are each smaller than one tenth of that of the hydride of A. By carrying out the deposition process using these hydrogenated gases and appropriately setting the substrate temperature, it is possible to obtain a film containing a significantly reduced amount of the non-objective substances (B, C and D) in comparison to those originally contained in the solid A. However, in the example shown in FIG. 4, the selectivity of element A relative to element E is A:E=9:2, which is rather low. In this case, the element selectivity can be improved by setting the temperature of the target at a level higher than 100° C.

Figure 5:
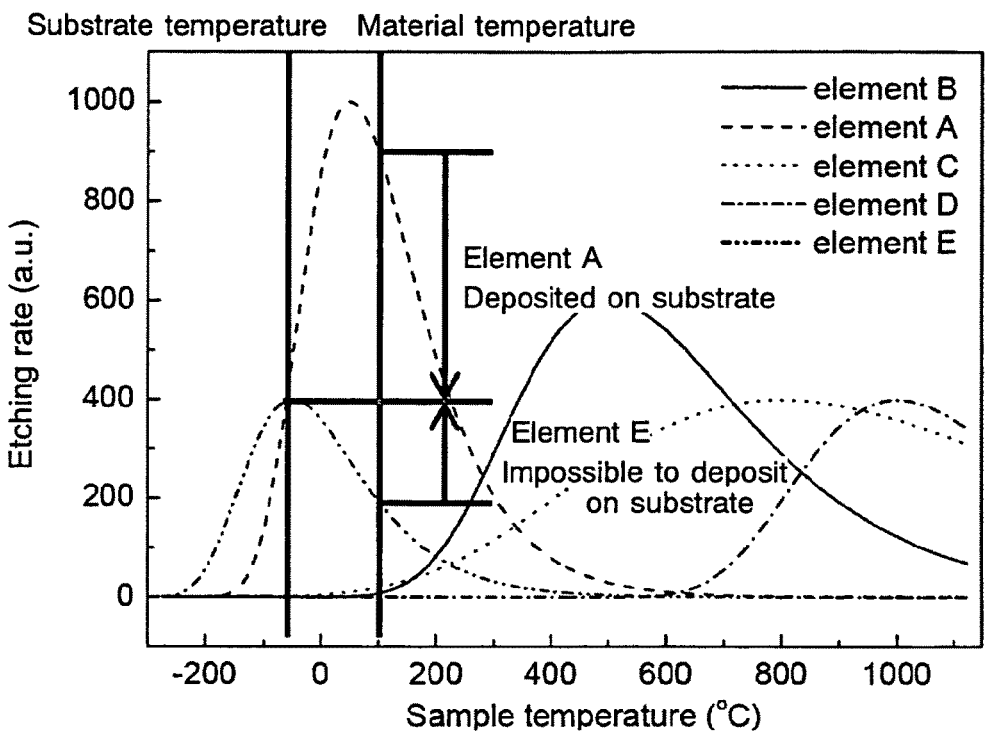
FIG. 5 is a graph illustrating the principle of a method of purifying an objective substance.

Even if it is difficult to appropriately set the target temperature, it is still possible to purify the objective substance by the following method: Suppose that the target temperature is set at approximately 100° C. and the substrate temperature at approximately −50° C., as shown in FIG. 5. Under this condition, for substance A, the etching rate on the target is higher than that on the substrate, so that the deposition of the substance onto the substrate will take place. Conversely, for substance E, which is a non-objective element mixed in the substance A, the etching rate on the substrate is higher than on the target. This means that the substance E can barely be incorporated into the substance A being deposited onto the substrate.

The foregoing discussion focused on the elements that could be hydrogenated. Iron (Fe), aluminum (Al) and other metals will barely be hydrogenated or only form non-volatile hydrides. Therefore, the etching rates of these kinds of metal are approximately zero. This is very advantageous in the case where only silicon is to be purely separated from metallurgical grade silicon, which inherently contains a considerable amount of Fe and Al.

Figure 6:
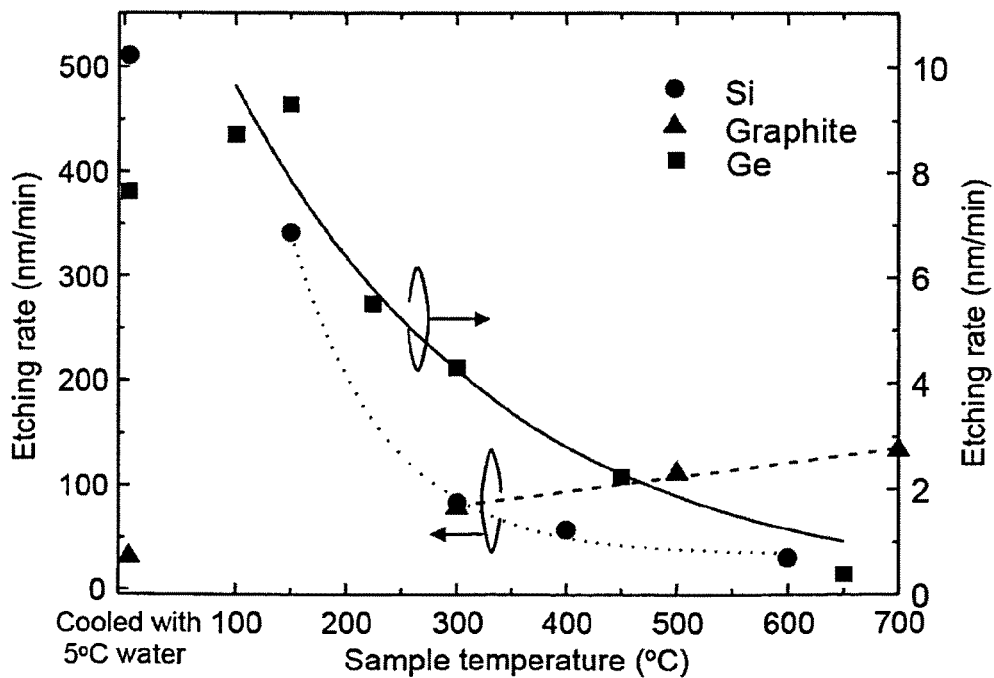
FIG. 6 is a graph showing the temperature-etching rate characteristics of silicon (Si), graphite and germanium (Ge).

The temperature-etching rate characteristics can be determined for various kinds of substances. For example, a graph of the temperature-etching rate characteristics of silicon (Si), graphite and germanium (Ge) is shown in FIG. 6. Thus, in the refined film producing method according to the present invention, what is required is to appropriately set the temperatures of the substrate and the target with reference to the temperature-etching rate characteristics of both the objective substance and the non-objective substances contained in the objective substance.

If the concentration of a non-objective substance cannot be lowered to a desired level by one cycle of the purification process, it is possible to carry out the refined film producing process according to the present invention again, using the previously obtained film as the new target. Repeating that process two or more times will further improve the purity of the objective substance.

In a system for carrying out a method according to the present invention (which will be detailed later), a heating/cooling mechanism may be provided on each of the substrate and target sides, as shown in FIG. 7. This configuration allows the high temperature side and low temperature side to be exchanged according to necessity, thereby eliminating the troublesome task of moving the previously created film to the target side while repeating the purifying process multiple times.

EXAMPLE 1

FIG. 8 schematically shows the construction of an example of the system for carrying out a method according to the present invention. Upper and lower electrodes are arranged parallel to each other within a reaction chamber. The upper electrode is provided with a water-cooling mechanism, and the lower electrode is provided with a heating mechanism using a susceptor (a heating medium). The lower electrode is grounded, while the upper electrode is supplied with a radio-frequency power through a matching box (MB). The lower electrode is vertically movable so that the distance between the upper and lower electrodes can be varied as desired. The reaction chamber can be tightly sealed. A reactant gas introduction system and an exhaust system are connected to the chamber.

Using this system, the following experiment was carried out: A single-crystalline silicon (001)-plate (substrate) exhibiting the p-type or n-type conductivity was set on the susceptor of the lower electrode, and another single-crystalline silicon (001)-plate (target material) whose conductivity was opposite to that of the substrate was attached to the lower surface of the upper electrode.

Using this system, a single-layer film of p, n-type silicon was created. In the present example, the target-substrate distance was 1 mm. For a natural cooling of the upper electrode, a cooling water of 20° C. was supplied into that electrode at a flow rate of 2 l/min. The lower electrode was maintained at specific temperatures between 200° and 600° C. with the susceptor.

The targets used in the present experiment were a p-type 4 inch Si(001) 0.002-0.01 Ωcm containing boron and n-type 4 inch Si(111) 0.002-0.01 Ωcm containing antimony. These silicon wafers were immersed into hydrogen fluoride (HF) for removing the natural oxidization film from their surface and then attached to the upper electrode.

Figure 9:
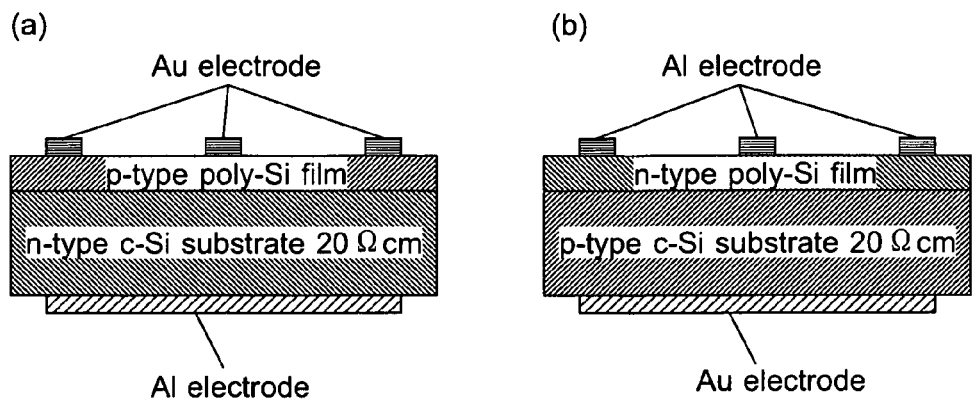
FIG. 9 is a cross-sectional view of the layered structure of two p-n junction products created by a film producing process, where (a) shows a p-type silicon film on an n-type single-crystalline silicon layer (p-n junction) and (b) shows an n-type silicon film on a p-type single-crystalline silicon layer (n-p junction).

As the substrate, an n-type 4 inch Si(001) having a resistivity of 5 to 20 Ωcm was used when the p-type silicon was used as the target, or a p-type Si(001) single-crystalline wafer having a resistivity of 5 to 20 Ωcm was used when the n-type silicon was used as the target. Each substrate was cleaned before it was used. The products created according to the present example have p-n junctions, as shown in FIGS. 9(a) and 9(b).

After the substrate was set on the susceptor of the lower electrode, helium gas in the reaction chamber was transferred to the outside. Then, a hydrogen gas, which had been purified by a hydrogen gas purifier with a palladium catalyst to an impurity concentration of 1 ppb or lower, was introduced into the chamber to a pressure level of 26.6 kPa (200 Torr). Subsequently, the hydrogen gas was supplemented at a rate of 10 SLM to maintain the aforementioned pressure; otherwise, the hydrogen pressure would gradually decrease during the deposition process due to a substrate-supporting vacuum chuck or other components. A radio-frequency power of approximately 1000 W was supplied from a radio-frequency power source of 150 MHz through the matching box to generate a hydrogen plasma between the target and the substrate. The area of the generated plasma was approximately 6×3 cm$^2$.

The deposition rate was calculated by measuring the weights of the substrate before and after the deposition process and dividing the increase in weight by the deposition area, the density of the single-crystalline silicon and the deposition time. In the case where a glass substrate was used, the deposition rate was obtained by stripping a portion of the film with a chemical, measuring that portion with a step tester having a stylus, and dividing the measured value by the deposition time.

The surface/cross-sectional geometry of the film was observed with a scanning electron microscope (SEM), and its surface crystallinity was observed by reflection electron diffraction (RED). The amount of hydrogen in the film was determined by thermal desorption spectroscopy (TDS) and infrared absorption spectroscopy.

(Deposition Rate)

Figure 10:
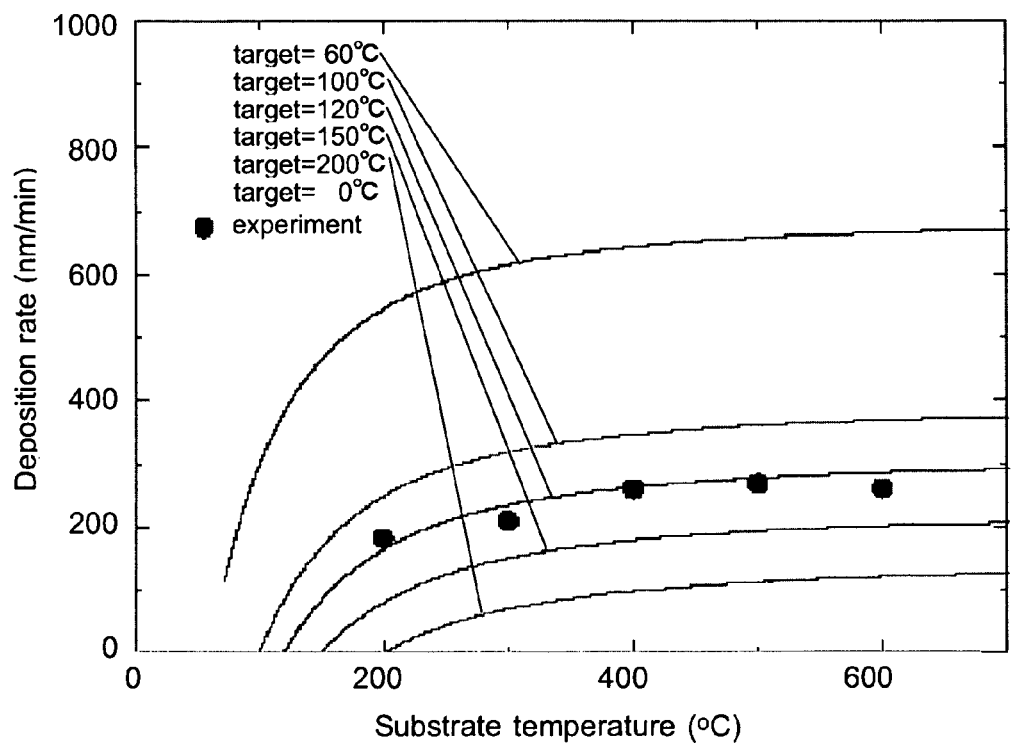
FIG. 10 is a graph showing a relationship between the substrate temperature and the deposition rate with the temperature of the target as a parameter.

In the present example, the deposition rate was dependent on the substrate temperature as shown in FIG. 10. This figure also shows curves representing theoretical values, which are identical to those shown in FIG. 2. The deposition rate monotonically increased until a substrate temperature of 400° C. Above this temperature, the deposition rate tended to saturate. This is because the etching rate exponentially decreases as the temperature increases, as shown by the theoretical curves, and so the etching rate of the substrate, which is maintained at a high temperature, can be disregarded in comparison to that of the target when the temperature is 400° C. or higher. Comparison with the theoretical curves also suggests that the cooling method used in the present example allowed the target temperature to rise to approximately 120° C.

The maximum deposition rate achieved by the present example was 249 nm/min (approx. 4 nm/sec). This value is approximately four times the maximum deposition rate achievable by the generally used low-pressure CVD methods: 1 nm/sec. Thus, the present method has been proven to be a high-speed film producing method. It is expected that the deposition rate of the method according to the present invention will further improve if a more efficient target-cooling method is used to further lower the temperature of the target.

The material usage efficiency was calculated from the weight of the film formed on the substrate and the etched amount of the target. The efficiency was dependent on the substrate temperature and the target-substrate distance, ranging from 95 to 98% when the substrate temperature was 400° C. or higher and the target-substrate distance was 1 mm. Even at a lower temperature of 200° C., the usage efficiency was 90%.

(SEM and Red Images)

Surface scanning electron microscope (SEM) images of silicon films created on a silicon (001)-substrate are shown in FIGS. 11(a) through 11(e), and reflection electron diffraction (RED) images of the same films are shown in FIGS. 12(a) through 12(e). In each group of images, (a), (b), (c), (d) and (e) correspond to substrate temperatures of 200° C., 300° C., 400° C., 500° C. and 600° C., respectively. The SEM images show that a characteristic orientation is observed on the films created at substrate temperatures of 400° C. or lower; a majority of the silicon grains are oriented so that their grain size increases only in two specific directions intersecting each other at right angles. This is because the substrate used was a (001)-silicon, in which the grains grow only in the [110] and [1-10] directions. The RED images show that the silicon film created at any of the aforementioned substrate temperatures is polycrystalline.

Figure 11:
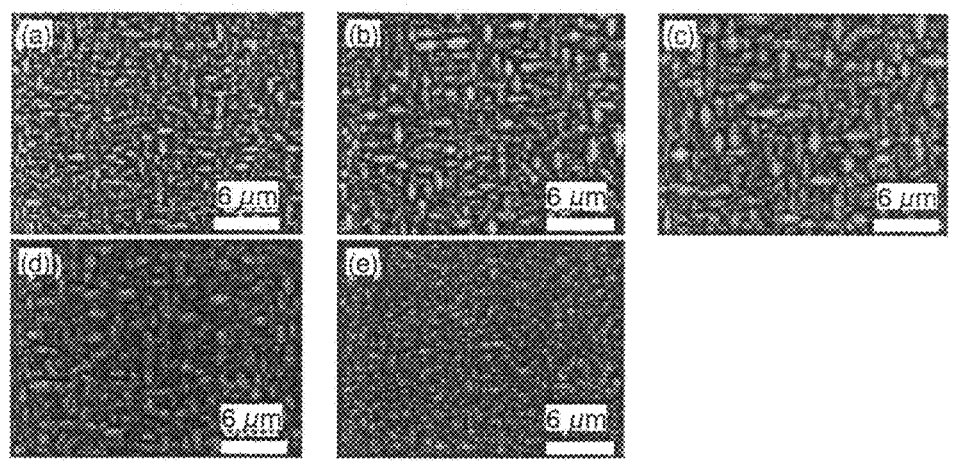
FIG. 11 shows surface scanning electron microscope (SEM) images of silicon films formed on silicon (001)-substrates at different substrate temperatures: (a) 200° C., (b) 300° C., (c) 400° C., (d) 500° C. and (e) 600° C., respectively.

It is generally known that a polycrystalline silicon film grown on a glass substrate under an abundance of atomic hydrogen will be a <110>-oriented film due to the difference in surface free energy and epitaxial growth rate between the plane directions. This holds true also in the film obtained in the present experiment, in which the <110>-directional growth is remarkable in the in-plane direction of the substrate. However, the film has another characteristic; the grains are oriented so that their growth directions are perpendicular to each other, as shown in FIG. 11. This means that, in the direction perpendicular to the substrate, a majority of silicon grains grow while maintaining the same orientation as that of the substrate, i.e. <001>. This inference is also supported by the RED images of FIG. 12, in each of which strong diffraction spots originating from a strongly oriented specific plane are observed in addition to a ring pattern.

On the other hand, FIG. 11 shows that the grain size increases with the substrate temperature when the temperature is 400° C. or lower. At 500° C., many crystal grains maintain the same orientation as observed at 400° C. or lower, while some grains are randomly grown in different directions. The image obtained at 600° C. shows a reduction in crystal grain size along with an undoubted decrease in the number of crystal grains whose growth directions maintain the in-plane anisotropy. The grain-size reduction most likely occurred because the increase of the substrate temperature caused more of the seeds contributory to be thermally decomposed and activated, helping the spontaneous nucleation and thereby increasing the number of nuclei for silicon growth. The reason for the decrease in the anisotropy of the in-plane growth direction with the increase of the substrate temperature is probably because the atomic hydrogen loses its etching effect.

(Cross-Sectional Geometry)

SEM images of the cross-sectional geometries of the films created at substrate temperatures of 200° C., 300° C., 400° C., 500° C. and 600° C. are shown in FIGS. 13(a) through 13(e).

These images show that the silicon films grew like pillars from the substrate surface. This fact indicates that the silicon films having the surface geometry as previously shown in FIG. 11 did not result from the deposition of fine particles but from continuous growth of silicon from the substrate. This finding suggests that the method according to the present invention is not accompanied by the generation of fine particles within the plasma; these particles often cause problems in the case where the film is rapidly grown by low-pressure CVD.

(Hydrogen in the Film)

Figure 12:
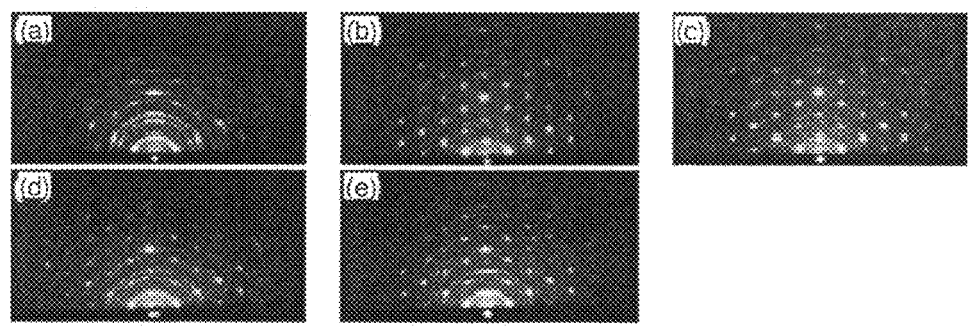
FIG. 12 shows reflection electron diffraction (RED) images of silicon films formed on silicon (001)-substrates at different substrate temperatures: (a) 200° C., (b) 300° C., (c) 400° C., (d) 500° C. and (e) 600° C., respectively.
Figure 13:
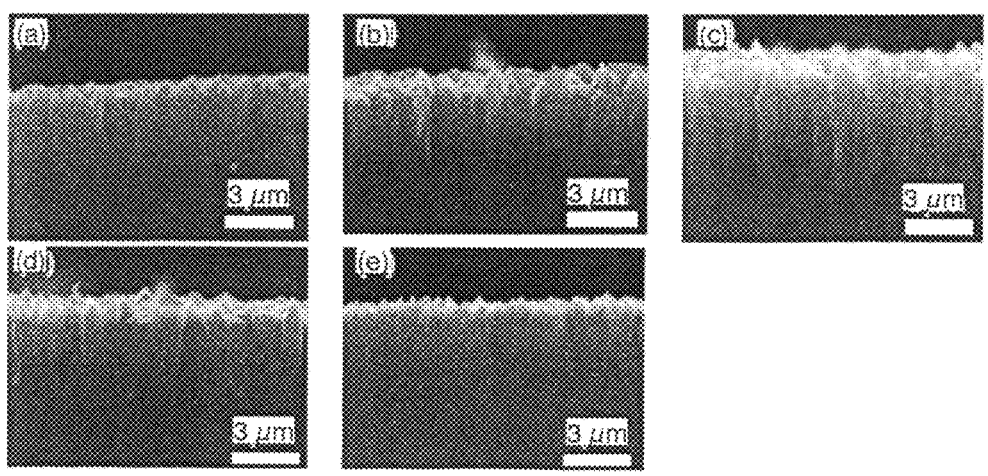
FIG. 13 shows cross-sectional scanning electron microscope (SEM) images of silicon films formed on silicon (001)-substrates at different substrate temperatures: (a) 200° C., (b) 300° C., (c) 400° C., (d) 500° C. and (e) 600° C., respectively.

FIGS. 12 and 13 show that silicon films created by the present method have a large number of grain boundaries. At these boundaries, there should be atoms of hydrogen, which is the only gas material used in the present method. Accordingly, a thermal desorption spectroscopy (TDS) analysis and infrared absorption spectroscopy (FTIR) analysis have been carried out to investigate in what form those hydrogen atoms are contained in the film and how they terminate the dangling bonds of silicon atoms present at the boundaries.

Figure 14:
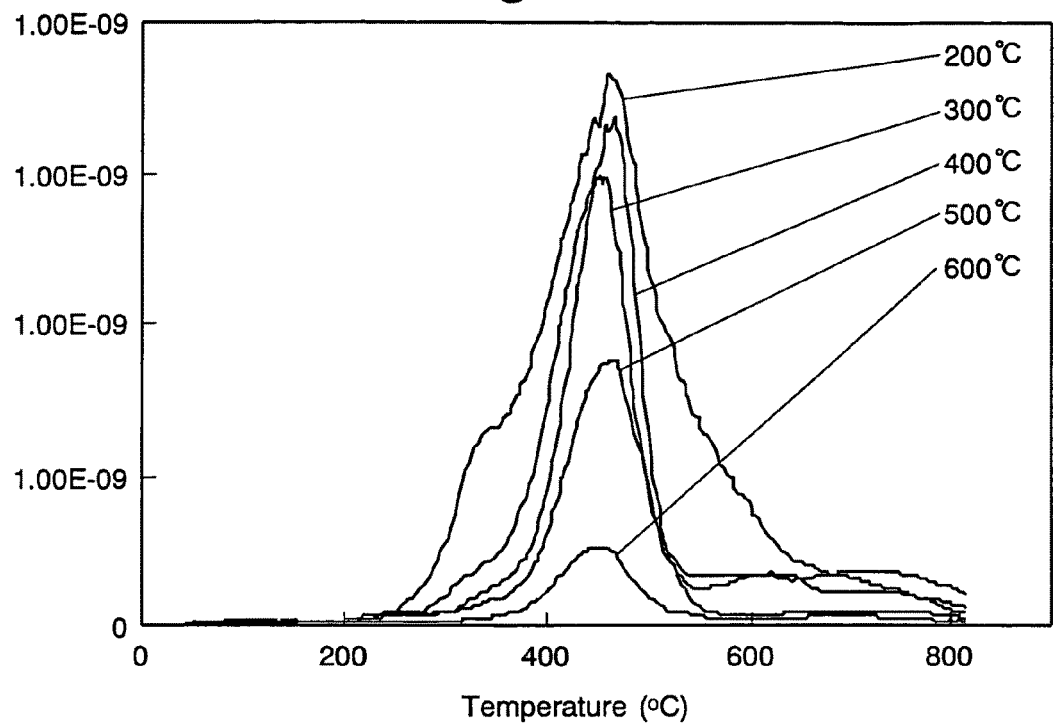
FIG. 14 shows a thermal desorption spectroscopy (TDS) spectrum of hydrogen desorbed from a silicon film formed on a silicon (001)-substrate.

TDS spectrums of hydrogen atoms desorbed from the silicon films created at the aforementioned temperatures are shown in FIG. 14. The temperature was raised from room temperature to 900° C. at a rate of 30° C./min. The graph shows that the hydrogen desorption spectrum changes its shape depending on the substrate temperature and those spectrums have hydrogen desorption peaks in the vicinity of 450° C. irrespective of the substrate temperature. Those peaks located near 450° C. are attributable to hydrogen atoms contained in —SiH (monohydride bond). The sub-peaks located on the high and low temperature sides of the 450° C. peak become more remarkable as the substrate temperature decreases. The sub-peak on the low temperature side originates from either —SiH$_2$ (dihydride bond) or —SiH$_3$ (trihydride bond). This sub-peak is clearly observed on the film created at a substrate temperature of 200° C. but only faintly at 300° C. At 400° C. or higher, it is no longer recognizable. The sub-peak on the high temperature side is said to originate from desorption of a hydrogen atom from an isolated SiH contained in the a-Si phase. This sub-peak is clearer on the silicon film created at lower substrate temperatures. This suggests that films created at low temperatures contain defects and/or amorphous silicon phases.

Figure 15:
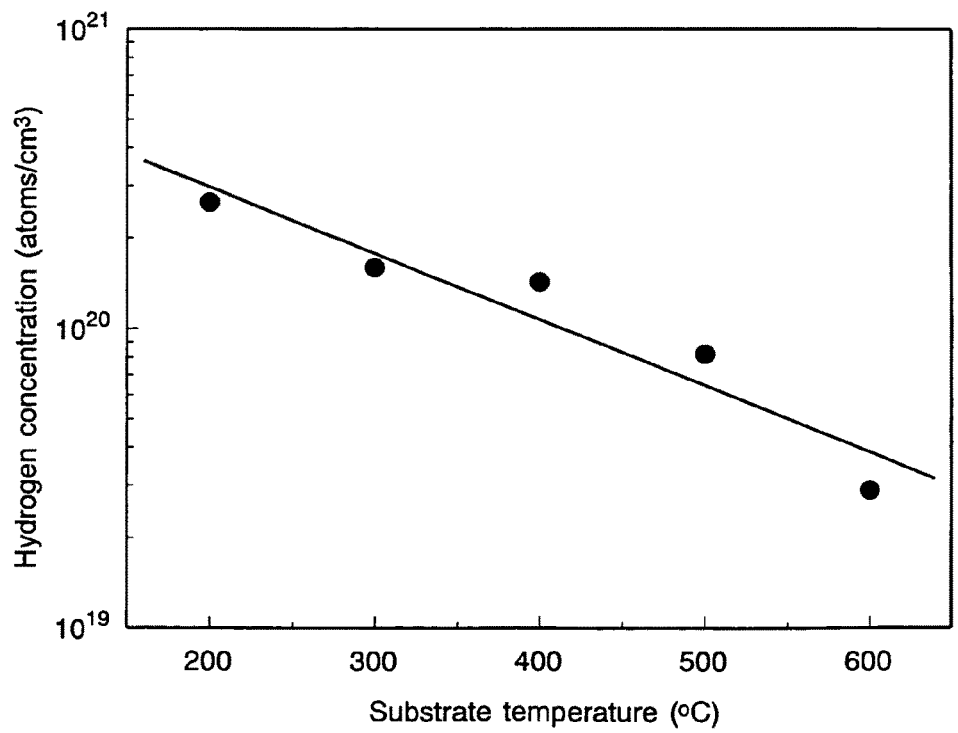
FIG. 15 is a graph showing a relationship between the hydrogen content of a silicon film and the substrate temperature.

By integrating each TDS spectrum shown in FIG. 14 and comparing the obtained value with the corresponding value of a hydrogen desorption spectrum from the surface of hydrogen-terminated single-crystalline silicon, the amount of hydrogen in the silicon film created at each substrate temperature was calculated. The result is shown in FIG. 15. The amount of hydrogen in the film is approximately within a range from $2 \times 10^{19}$ to $3 \times 10^{20}$ atoms/cm$^3$. The value exponentially decreases with the increase in the substrate temperature.

Figure 16:
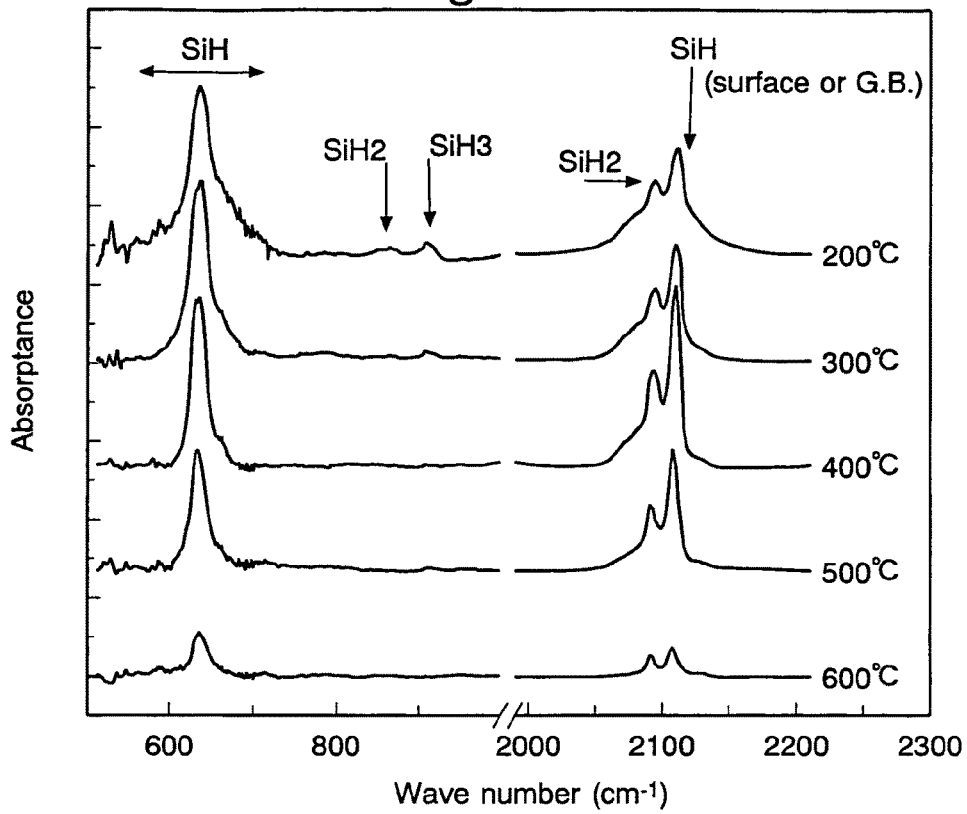
FIG. 16 shows FTIR absorption spectrums of silicon films formed on silicon (001)-substrates at different substrate temperatures.

To identify the type of hydrogen bond present in the film, an FTIR analysis was carried out focusing on the absorption peaks associated with SiH$_x$, which would appear at 640 cm$^{-1}$, 880 cm$^{-1}$, 910 cm$^{-1}$, 2087 cm$^{-1}$ and 2102 cm$^{-1}$. The FTIR spectrums of the silicon films created at the aforementioned substrate temperatures are shown in FIG. 16. At any of those substrate temperatures, the created film exhibits clear peaks at 640 cm$^{-1}$, 2087 cm$^{-1}$ and 2102 cm$^{-1}$.

Generally, a —SiH bond contained in the bulk of amorphous silicon has an absorption peak at 2000 cm$^{-1}$. This peak originating from the amorphous silicon was not observed on the films created by the present method. Combining this finding with the result of the previous TDS analysis enables the inference that crystal films created at lower substrate temperatures contain more defects, yet these defects are terminated and inactivated by hydrogen.

The peaks located at around 2087 cm$^{-1}$ and 2102 cm$^{-1}$ originate from the hydrogen atoms adsorbed on the silicon crystal surface. The presence of those peaks indicates that hydrogen atoms are contained in the silicon films created by the present method in such a state where they passivate the dangling bonds at the surface and boundaries.

The film created at the high substrate temperature of 600° C. also contains hydrogen that can be observed by TDS and FTIR. This is most likely because the silicon film is still exposed to the hydrogen atmosphere during the temperature-decreasing stage after the deposition process.

EXAMPLE 2

(Pressure Dependency of Deposition Rate)

Figure 17:
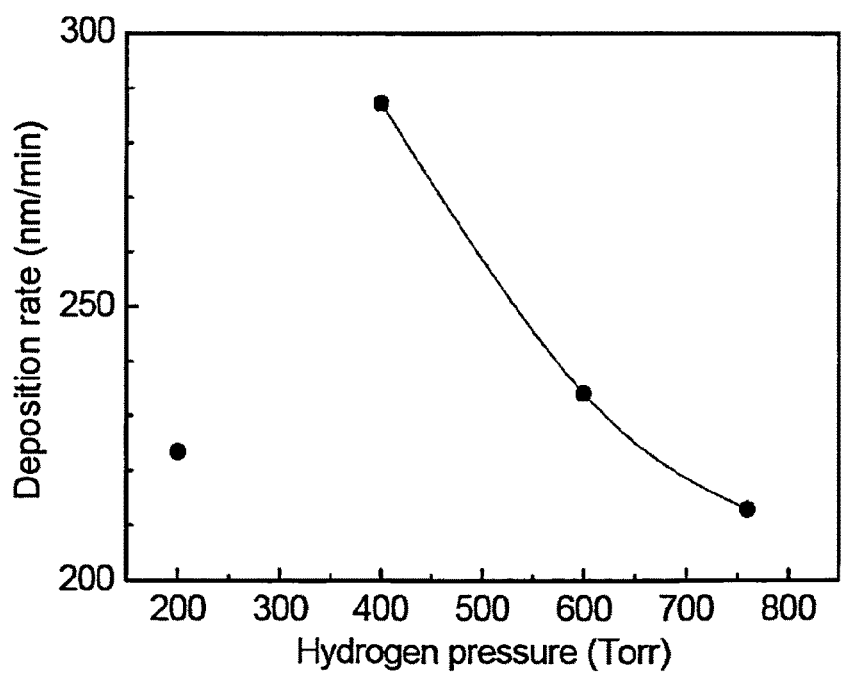
FIG. 17 is a graph showing the deposition rate changing with the hydrogen pressure within a reaction chamber in which silicon was used as the target.

FIG. 17 shows the result of investigation of how the deposition rate varies when the hydrogen pressure within the reaction chamber is changed, using silicon as the target. The power supply was controlled so that the amount of power supplied per unit of hydrogen molecule was maintained at a constant level. Specifically, the power was increased with respect to pressure with a proportionality factor of 0.7 W/Torr. For example, the power was 140 W for a hydrogen pressure of 26.6 kPa (200 Torr), and 280 W for 53.3 kPa (400 Torr). The target-substrate distance was 600 µm and the substrate temperature was 400° C. The experiment demonstrated that the deposition rate was maximized when the hydrogen pressure was 53.3 kPa (400 Torr), as shown in FIG. 17. However, it should be noted that the difference in deposition rate is minor as compared to the pressure change. Probably, under the conditions that the pressure is equal to or higher than 26.6 kPa (200 Torr) and the power per unit of molecular weight is constant, the power supply is a more important factor in governing the deposition rate than the ambient pressure, which is only a minor factor.

EXAMPLE 3

(Dependency of Deposition Rate on Target-Substrate Distance)

Figure 18:
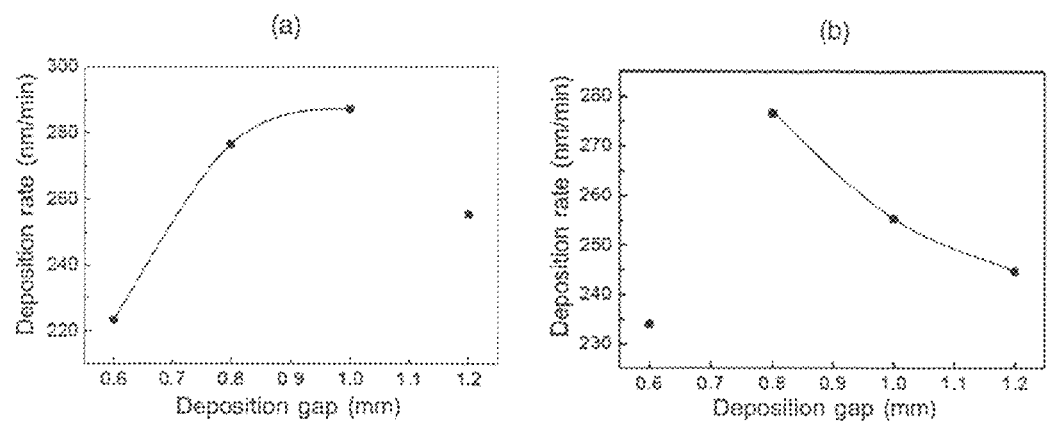
FIG. 18 shows graphs representing the dependency of the deposition rate on the target-substrate distance.

FIG. 18 shows graphs representing the dependency of deposition rate on the target-substrate distance ("deposition gap"); FIG. 18(a) corresponds to the case where the power density was maintained constant relative to the plasma volume and FIG. 18(b) corresponds to the case where the power was simply maintained constant. In both cases, the experiment was carried out with a hydrogen pressure of 26.6 kPa (200 Torr) and a substrate temperature of 400° C. The power supply was 0.58 W/mm$^3$ in case (a) and 140 W in case (b).

FIGS. 18(a) and 18(b) each show that the deposition rate decreases if the deposition gap is too small. A possible reason for this phenomenon is because reducing the distance between the electrode and substrate causes an excessive rise in the temperature of the target due to the radiation or gas-conduction of heat from the substrate (at 400° C. in the preset experiment). This reasoning suggests that efficient cooling of the target is critical if the deposition process is carried out at 400° C. or higher temperatures. The two graphs also show that the deposition rate uniformly decreases as the target-substrate distance increases. In case (a), where the power density is maintained constant, the decrease in deposition rate is attributable to the fact that increasing the target-substrate distance causes a decrease in concentration gradient and thereby lowers the speed of mass transfer by diffusion. In case (b), where the power is maintained constant, the deposition rate seems to be complexly affected by not only the aforementioned decrease in the mass transfer speed but also a decrease in the power density of the plasma.

The foregoing discussion has proved that providing too large a distance between the target and the substrate will cause the deposition rate to decrease. Such an operation is not recommendable not only because it decreases the deposition rate but also because it makes the plasma unstable.

EXAMPLE 4

(Dependency of Deposition Rate on Power Density)

Figure 19:
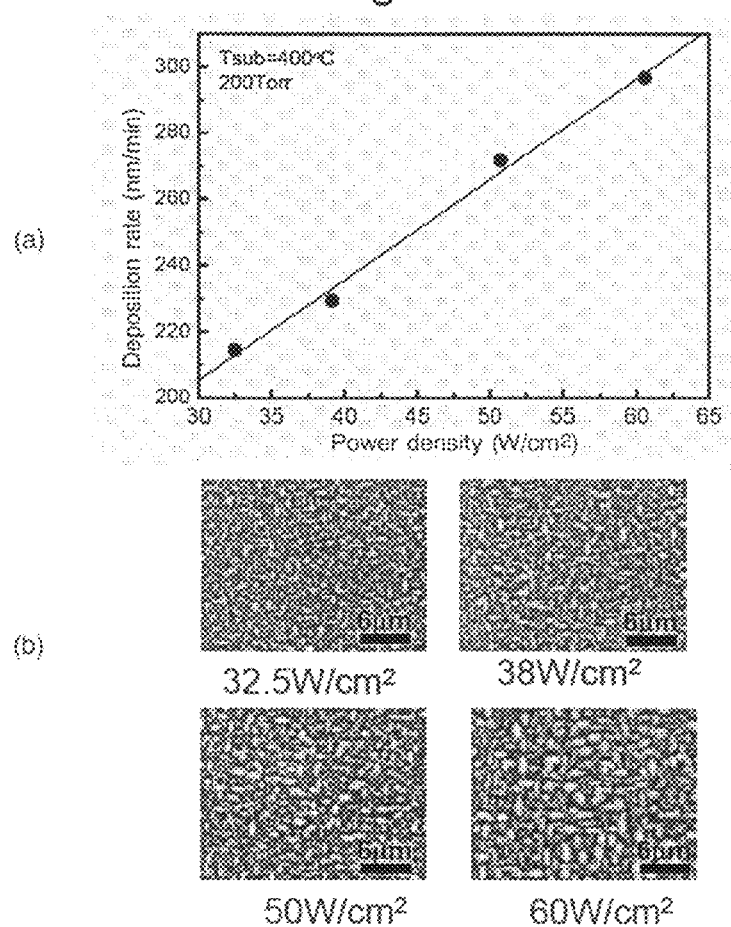
FIG. 19 shows (a) a graph showing a change of the deposition rate observed when the power supplied to the plasma was changed while the substrate temperature, the hydrogen pressure and the target-substrate distance were maintained, and (b) surface SEM images of silicon films.

FIG. 19(a) is a graph showing a change of the deposition rate observed when the power supplied to the plasma was changed while the substrate temperature was maintained at 400° C., the hydrogen pressure at 26.6 kPa (400 Torr) and the target-substrate distance at 1 mm. This graph shows that the deposition rate approximately linearly increases with the increasing power supply. Under the aforementioned experimental conditions, the maximum deposition rate of approx. 5 nm was achieved. FIG. 19(b) shows surface SEM images of silicon films created with the different amounts of power supply. Those images show that the silicon films obtained under the aforementioned different experimental conditions still have substantially identical natures, although the size of silicon grains observed on the surface varies depending on the thickness of the silicon film created.

EXAMPLE 5

(Formation of Thick Silicon Film by Long-Period Deposition Process)

Figure 20:
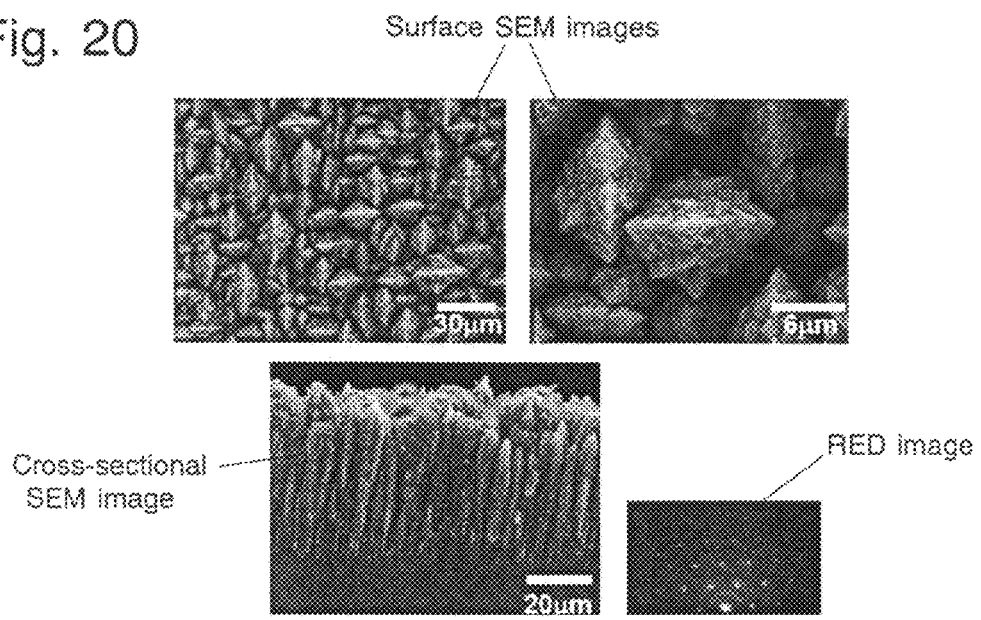
FIG. 20 shows surface SEM images and a cross-sectional SEM image of a silicon film obtained through a deposition process continued for 120 minutes, and an RED image of the same film.

A long-period deposition process was carried out to determine whether the quality of the silicon target would change after a long period of usage and affect the deposition rate, structure and other properties of the film. FIG. 20 shows surface SEM images and a cross-sectional SEM image of a silicon film obtained through a deposition process continued for 120 minutes, and a reflection electron diffraction (RED) image of the same film. The cross-sectional SEM image shows that the film continued growing like pillars even after it reached a thickness of approx. 50 μm. The surface SEM images show that the film grew maintaining the same in-plane orientation as that of the substrate. The largest grain has reached 30 μm in grain size. In addition, under the present experimental conditions, there was no significant difference between the deposition rate immediately after the beginning of the deposition process and that at the end of the same process.

EXAMPLE 6

(Relationship Between Orientation of Silicon Film and Substrate Temperature)

Figure 21:
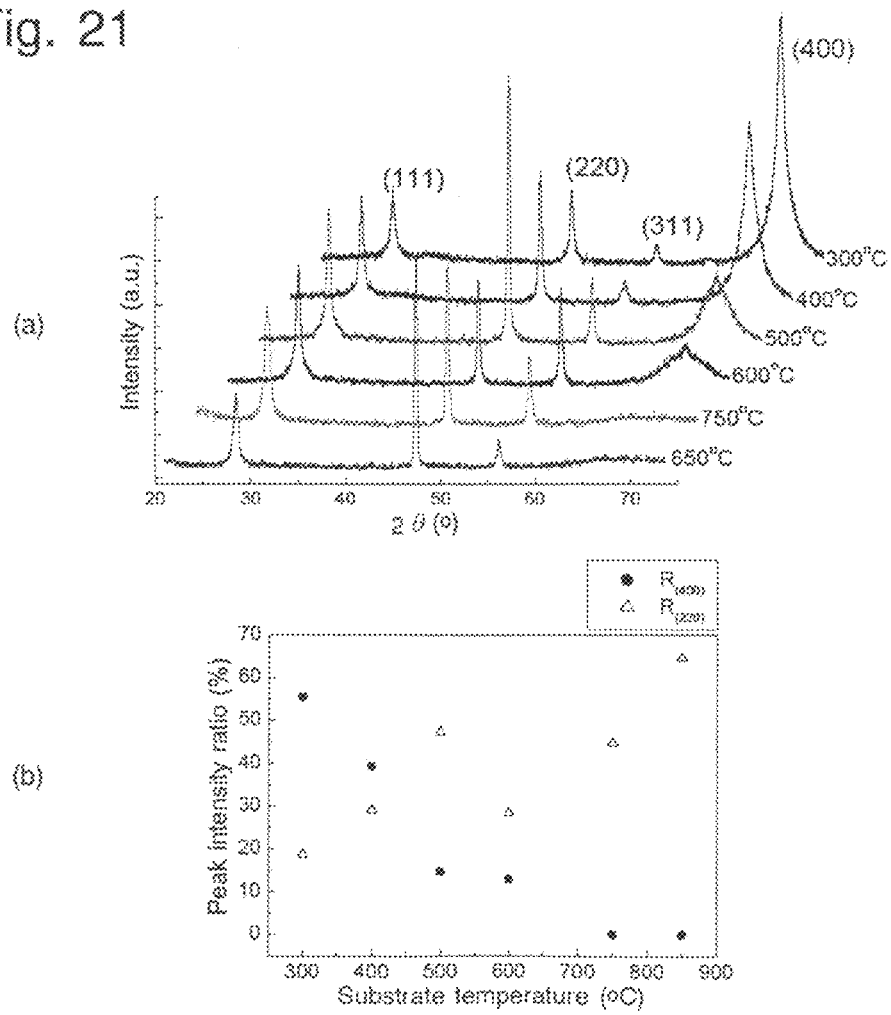
FIG. 21(a) is an X-ray diffraction graph showing the orientation characteristics of silicon films created at various substrate temperatures.
FIG. 21(b) is a graph showing how the ratios of the intensity of (400) and (220) diffraction peaks to the total intensity of the peaks originating from (111), (220), (311) and (400) change with the substrate temperature.

FIG. 21(a) shows the result of an X-ray diffraction measurement for investigating the orientation characteristics of silicon films created at various substrate temperatures. The deposition conditions (except the substrate temperature) were as follows: the hydrogen pressure was 26.6 kPa (200 Torr), the power supply was 1000 W (18 cm$^2$), and the target-substrate distance was 1000 μm. As shown in FIG. 21(a), diffraction peaks originating from (111), (220), (311) and (400)-planes were observed.

Based on that graph, a calculation was made to determine how the ratios of the intensity of the (400) and (220)-peaks to the total intensity of the peaks originating from the aforementioned four planes would change with the substrate temperature. The result is shown in FIG. 21(b), which shows that the ratio of (400)-peak rapidly decreases as the temperature increases, whereas the ratio of (220)-peak increases. Since the substrate used in the present example was a silicon (100)-substrate, it is clear that, as the temperature becomes lower, the film created by the present method will be more affected by the orientation of the substrate. By contrast, as the temperature rises, the orientation of the film disappears from that of the substrate and approximates to the (220) or random orientations.

The decrease of the (400)-peak intensity is particularly remarkable when the substrate temperature is raised from 300° to 500° C. This temperature range coincides with the desorption temperatures of the hydrogen atoms adsorbed on the silicon surface. It is generally known that the surface free energy of a bare surface of silicon is most stabilized on the (111)-plane while the surface free energy of a silicon surface with hydrogen atoms adsorbed thereon is most stabilized on the (100)-plane. These facts suggest that the strengthening of the (400)-peak with the lowering of the temperature in the present experiment can be associated with an important action of hydrogen atoms adsorbed on the growing surface. This further leads to an expectation that the film producing method according to the present invention will enable homoepitaxial growth of silicon under cryogenic conditions by selecting appropriate deposition conditions for maintaining the substrate at low temperatures at which a perfectly hydrogen-terminated surface can be retained.

EXAMPLE 7

(Deposition by Helium Dilution)

Figure 22:
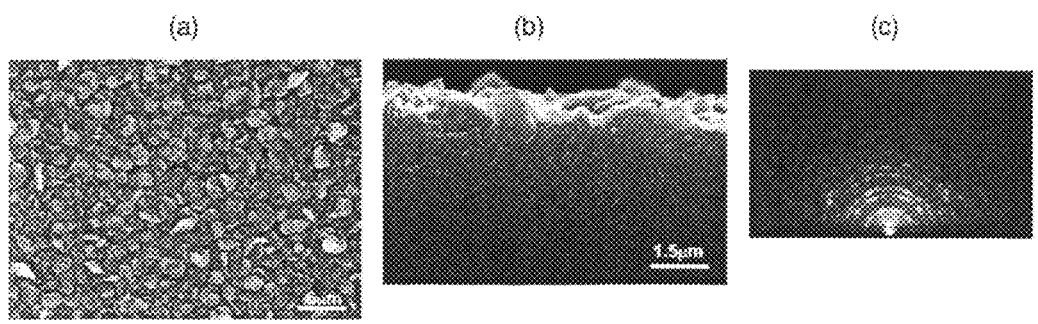
FIG. 22 shows (a) a surface SEM image, (b) a cross-sectional SEM image and (c) an RED image of a silicon film created under the conditions that a helium gas was introduced into a hydrogen gas at 26.6 kPa (200 Torr) and the total pressure within the reaction chamber was set at 101 kPa (760 Torr).

FIG. 22 shows (a) a surface SEM image, (b) a cross-sectional SEM image and (c) an RED image of a silicon film created under the conditions that a helium (He) gas was introduced into a hydrogen gas at 26.6 kPa (200 Torr) and the total pressure within the reaction chamber was set at 101 kPa (760 Torr). The deposition conditions were as follows: the power supply was 1000 W (18 cm$^2$), the target-substrate distance was 1000 μm, the substrate temperature was 400° C., and the deposition time was 15 minutes.

As shown in FIG. 22, it has been confirmed that, even if the hydrogen gas is diluted with the helium gas, a silicon film can be created as in the case where only the hydrogen gas was used. However, the deposition rate decreased to 90 nm/min, which is much lower than the rate that is achieved when only the hydrogen gas at a pressure of 26.6 kPa (200 Torr) is introduced (i.e. approximately 240 nm/min). This is most likely because the power supplied to the plasma is consumed not only for the decomposition and excitation of hydrogen but also for excitation of helium, and also because the transport of SiH$_4$, which is generated on the target, to the substrate surface is impeded by the diluent helium.

In the present example, the SEM image of the silicon film shows that the crystal grains are not anisotropically grown in the in-plane <110>-direction, unlike the crystal grains of silicon films grown with only the hydrogen gas. Furthermore, the cross-sectional image shows that no pillar-like structure is clearly grown. These facts suggest that the addition of the helium gas, whose excitation lifetime and excitation energy differ from those of the hydrogen gas, has created a plasma state whose electron temperature, gas temperature and other properties differ from those of the conventional plasma containing only hydrogen, and thereby affected the structure of the silicon film to be created. This also means that the film structure of the silicon film created according to the present invention can be modulated by intentionally mixing a rare gas into the plasma.

In the case where a gas composed of hydrogen mixed with a rare gas is used as the reactant gas, the amount (or partial pressure) of the rare gas to be introduced may be freely determined according to necessity; the only requirement is to set the partial pressure of hydrogen within a range from 10 to 202 kPa (76 to 1520 Torr).

EXAMPLE 8

(Deposition onto Quartz Glass Substrate)

Figure 23:
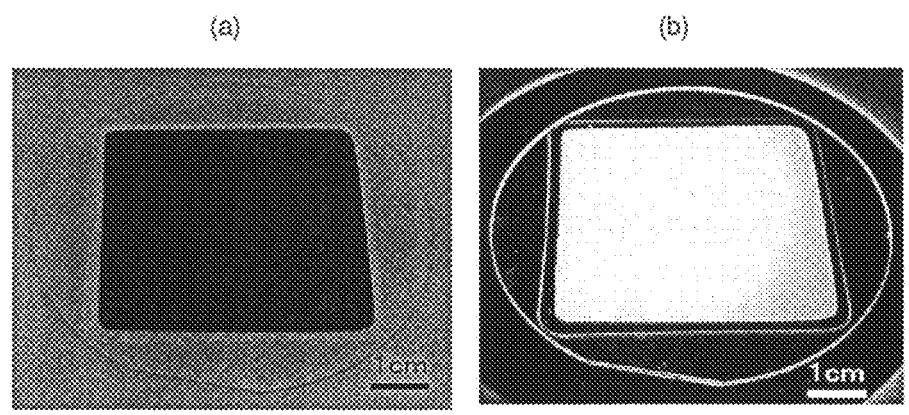
FIG. 23 shows actually observed images of a silicon film formed on a quartz glass at a substrate temperature of 400° C., where (a) is an image observed under fluorescent lighting, and (b) is an image observed under a beam-condensing halogen lamp.

FIG. 23 shows actually observed images of a silicon film formed on a quartz glass substrate at a substrate temperature of 400° C., where (a) is an image observed under fluorescent lighting, and (b) is an image observed under a beam-condensing halogen lamp. Under the fluorescent lighting, the film looks dark because the surface of the film is uneven and its reflectance is significantly low. This will be very advantageous for applications in solar cells, in which it is necessary to increase the absorption of light in the power-generation layer in some way to improve the conversion efficiency. It has been confirmed that the deposition of film onto the glass substrate can take place within a range from 200° to 600° C. Irrespective of the temperature, the silicon film thereby created will be a polycrystalline silicon film, which is firmly adhered to the substrate and will never be easily stripped, as proved by a simple tape adhesion test.

EXAMPLE 9

A useful application of the present method is a doping method that does not use expensive, harmful doping gases. An experiment of such a method was carried out as the present example. The apparatus used and its operational conditions are substantially the same as those in Example 1 and will not be detailed in this section.

In the present method, doping of a silicon film can be achieved by mixing a dopant element (e.g. B, P, As or Sb) into the target beforehand and hydrogenating the dopant element simultaneously with etching the silicon target; then, hydrogenated dopant turns into vapor and penetrates into the silicon film on the substrate. Both p-type and n-type silicon films were created. A gold (Au) electrode was vacuum-deposited on the p-type silicon film and an aluminum (Al) electrode on the n-type, and I-V characteristics of a p-n device were measured.

The target used in the present example had been pre-doped with either boron (B) or antimony (Sb). The experiment focused on whether these dopants had transported to the silicon film created.

The experiment used B-doped p-type silicon targets, one having a resistivity of 1 Ωcm and the other 0.02 Ωcm. Using these targets, a deposition process was performed at a substrate temperature of 600° C. for 15 minutes. This process used a quartz substrate instead of a silicon substrate to avoid the situation where the impurities contained in the silicon substrate are transported into the silicon film created.

Figure 24:
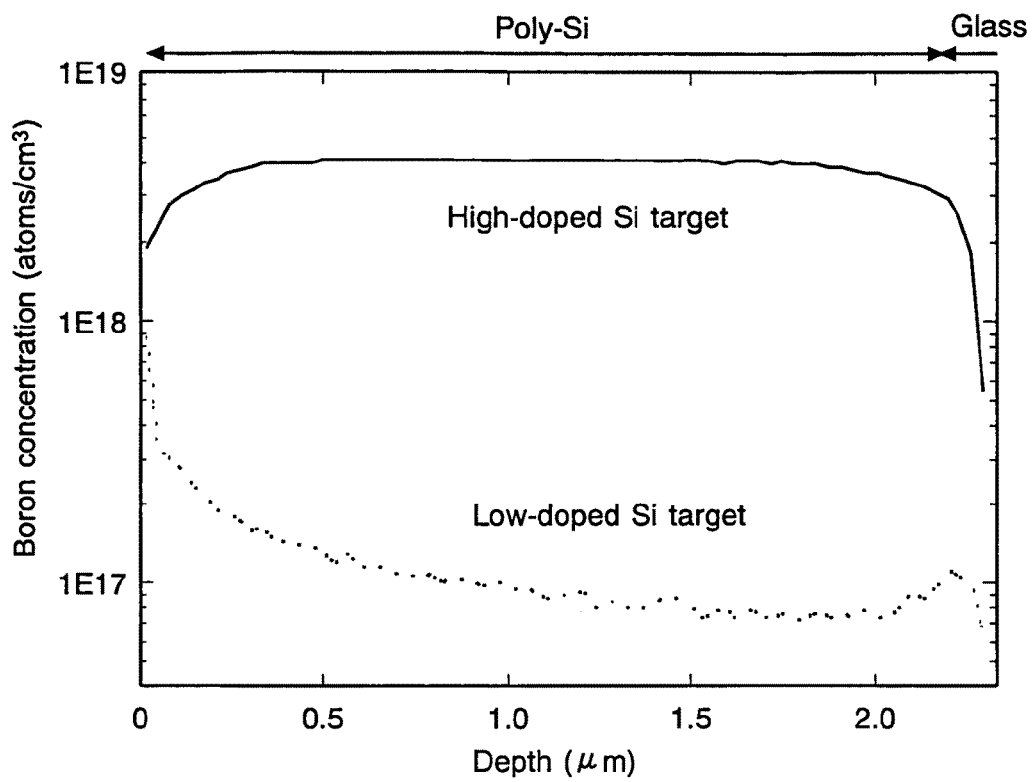
FIG. 24 shows the distribution of boron (B) concentration in the film thickness direction within a silicon film.

The distribution of boron concentration in the thickness direction within the created silicon film was evaluated by secondary ion mass spectrometry. The result is shown in FIG. 24. This figure shows that the film contained $4 \times 10^{18}$ boron atoms/cm$^3$ when the low-resistivity silicon target was used, and $8 \times 10^{16}$ boron atoms/cm$^3$ when the high-resistivity silicon target was used. Thus, the concentration of the impurity in the silicon film changes according to the concentration of the impurity in the silicon target. This fact proves that the present method enables a doping-gas-free control of the resistivity of the silicon film, in which only the impurity concentration of the silicon target needs to be regulated.

(Electrical Characteristics)

In the present method, it is possible to control the conduction type of the resulting silicon film by using a target containing controlled impurities, as demonstrated by the following experiments.

The first experiment used targets made of B-doped p-type silicon (001) ranging from 0.001 to 0.02 Ωcm in resistivity and substrates made of P-doped n-type silicon (001) ranging from 5 to 20 Ωcm in resistivity. With this combination of target and substrate materials, it is expected that the boron atoms in the target will form hydride and penetrate into the film being created on the substrate, producing a device having a p-n diode structure. Accordingly, in the created device, a gold electrode of 1 mm in diameter was deposited on the film surface and an aluminum electrode of 1×2 cm in size was deposited on the bottom surface of the substrate, both electrodes being approximately 500 nm in thickness, and the diode characteristics of the device were evaluated.

Figure 25:
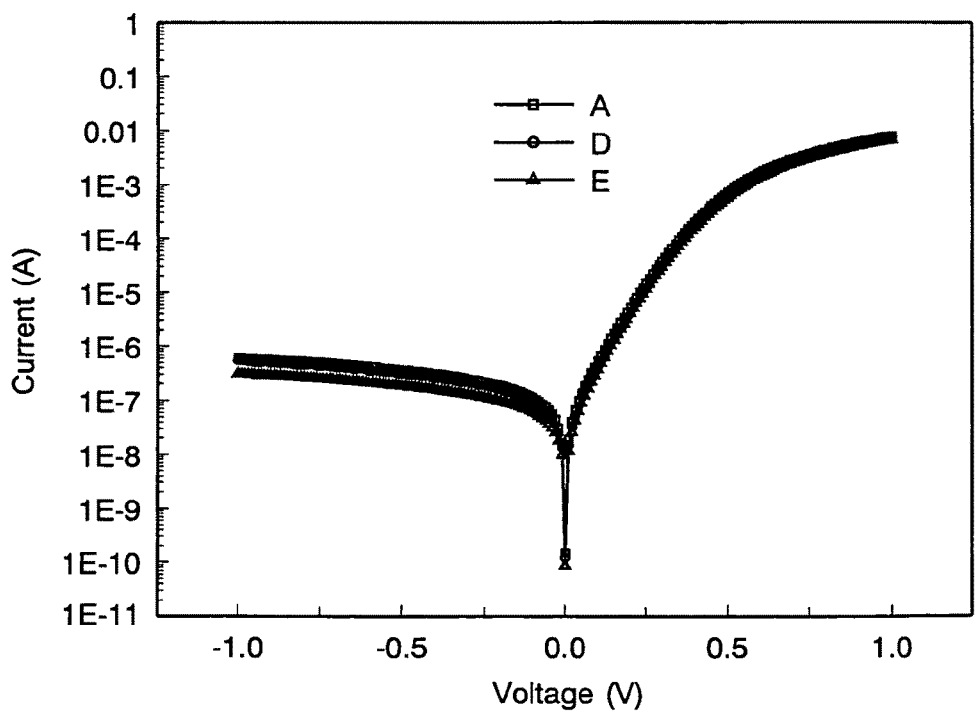
FIG. 25 shows the I-V characteristics of a p-n device created.

FIG. 25 shows the I-V characteristics of a p-n device created at a substrate temperature of 400° C., using a radio-frequency power of 1 kW, with a deposition gap of 1 mm. The graph shows the rectifying characteristic, which is typically exhibited by a device consisting of an n-type silicon substrate with a p-type silicon film laminated thereon. The ideality factor of this diode was n=1.3. Thus, the result of this experiment has proved that it is possible to make the resulting silicon film a p-type silicon film by mixing boron, a p-type impurity, into the silicon target.

The second experiment used Sb-doped n-type silicon (111)-targets ranging from 0.001 to 0.02 Ωcm in resistivity and B-doped p-type silicon (001)-substrates ranging from 1 to 20 Ωcm in resistivity to create an n-type silicon film. With this combination of target and substrate materials, it is expected that the antimony atoms in the target will form hydride and penetrate into the film being created on the substrate, producing an n-p diode. The conditions of creating the silicon film were substantially the same as those in the first experiment.

Figure 26:
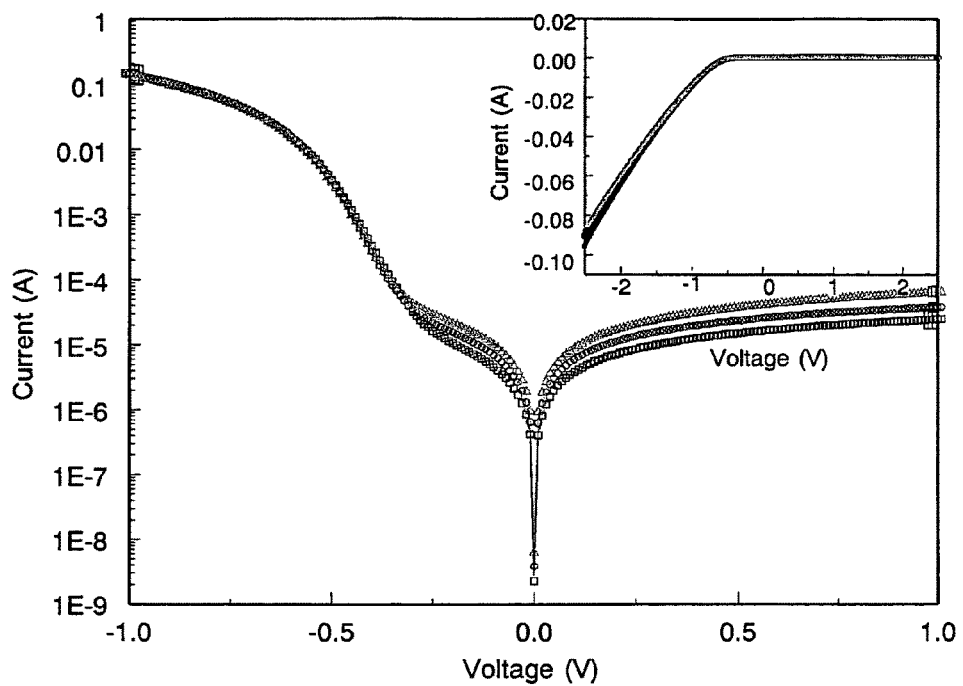
FIG. 26 shows the I-V characteristics of an n-p device created.

The result is shown in FIG. 26, supplemented with a linear-scale graph. As opposed to the previously described p-type device, the present device allowed the forward current flow when a negative bias was applied to the upper electrode. When a positive bias was applied, a component originating from the recombination current in the depletion layer was observed. This component was not clearly observed in the p-type device.

Thus, the results of the two experiments prove that both n-type and p-type silicon films can be selectively created by the present method without using any doping gas.

EXAMPLE 10

Reduction of material costs is essential for widespread use of solar cells. Accordingly, an experiment was carried out to investigate whether thin-film p-n diodes can be produced by the method according to the present invention. The apparatus used and its operational conditions are substantially the same as those in Example 1.

Figure 27:
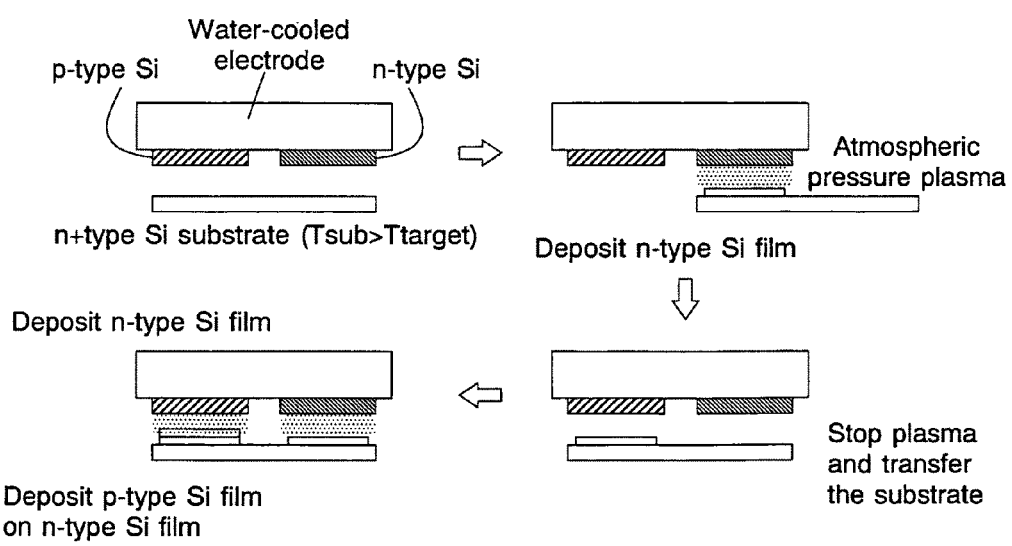
FIG. 27 is a flow chart of a process of fabricating a thin-film p-n diode.

FIG. 27 illustrates the deposition process. The process used an n-type silicon target (Sb-doped, resistivity=0.018 Ωcm) and a p-type silicon target (B-doped, resistivity=0.02 Ωcm), both being attached side by side on a water-cooled electrode, and a Sb-doped n-type silicon (111)-substrate having a resistivity of 0.005 Ωcm. With this system, first, a hydrogen plasma was generated below the n-type silicon target to deposit an n-type silicon film on the substrate.

After the plasma was temporarily extinguished, the region of the substrate on which the n-type silicon film had been created was transferred to a position below the p-type target, and then the plasma was generated again to create a p-type silicon film. By these sequential operations, it is possible to create a region in the substrate plane where an n-type silicon film and a p-type silicon film deposited thereon form a p-n junction in the direction normal to the substrate plane. In the present case, both p-type and n-type layers were each approximately 5 μm thick.

Figure 28:
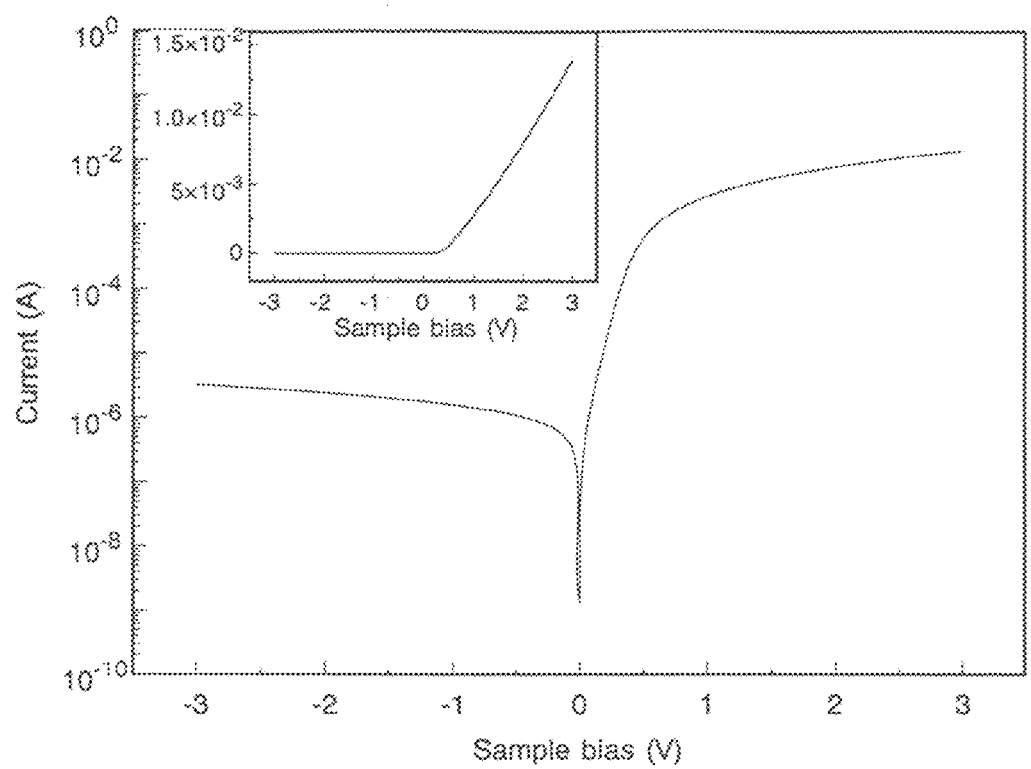
FIG. 28 shows the I-V characteristics of a p-n diode created.

I-V characteristics of the region in which the thin-film p-n junction was formed were investigated. The result is shown in FIG. 28. This figure shows that the p-n junction diode formed by the silicon films created by the present method exhibits a rectifying effect and its rectifying characteristic is better than that of p-n junction diodes used in commercially available bulk polycrystalline solar cells.

Figure 29:
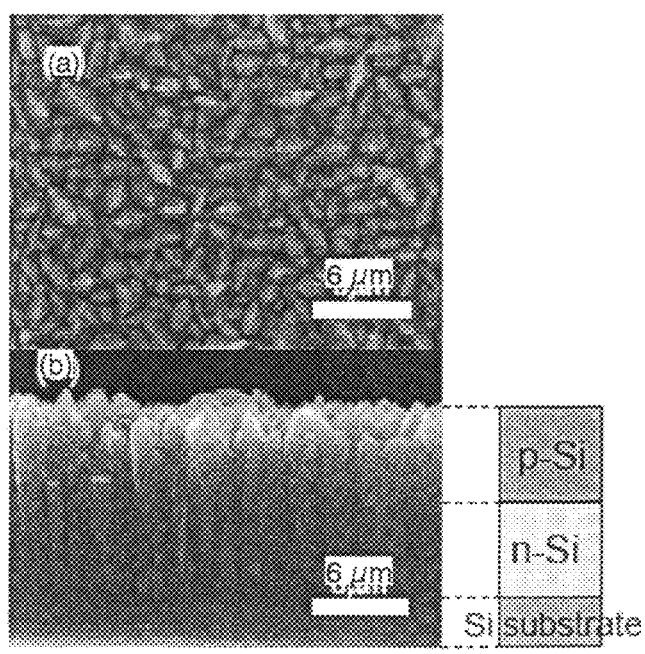
FIG. 29 shows (a) a surface SEM image and (b) a cross-sectional SEM image of the p-n diode created.

The surface SEM image in FIG. 29(*a*) shows that the p-n junction diode of the silicon films created are composed of silicon grains having diameters of 2 to 3 μm, and most of those silicon grains are oriented in the <110>-direction with three-fold rotational symmetry due to the symmetry of the silicon (111)-substrate used.

In the cross-sectional image shown in FIG. 29(*b*), no clear interface can be observed between the p-layer and n-layer of the grown silicon film, although the plasma was temporarily turned off during the deposition of those two layers. This observation proves that the silicon grains continuously grow even if the plasma is temporarily extinguished. This fact suggests that, in the case of applying the present film producing method to a large area substrate, it is possible to continuously create a film by scanning the substrate.

EXAMPLE 11

The present film producing method is applicable to not only silicon but also other materials. To show an example, a germanium film was created. The apparatus used and its operational conditions are substantially the same as those in Example 1.

First, a film was created on a quartz substrate, using a germanium target. The hydrogen pressure was 26.6 kPa (200 Torr), the power supply was 1000 W, the target-substrate distance was 1000 μm, and the substrate temperature was varied between 300° and 700° C.

Figure 30:
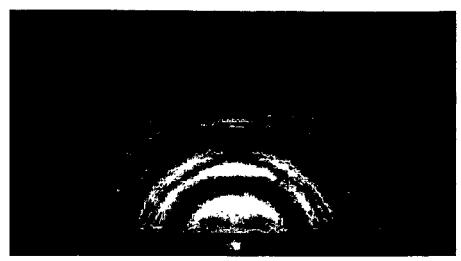
FIG. 30 is an RED image of a germanium film created.
Figure 31:
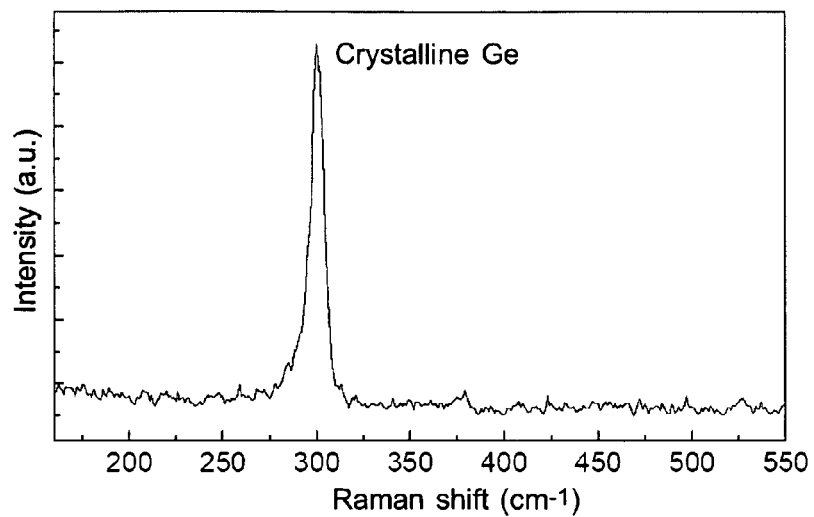
FIG. 31 shows the Raman spectrum of the germanium film created.

FIG. 30 is an RED image of a created film. It shows that the germanium film created at substrate temperatures between 300° and 700° C. is polycrystalline. The Raman spectrum of the created film shown in FIG. 31 exhibits a sharp peak at around a wave number of 300 cm$^{-1}$, proving that a crystalline germanium was created. To evaluate the degree of adhesion between the germanium film created in the present example and the quartz substrate, a simple tape test was carried out, in which no stripping of the film took place.

Figure 32:
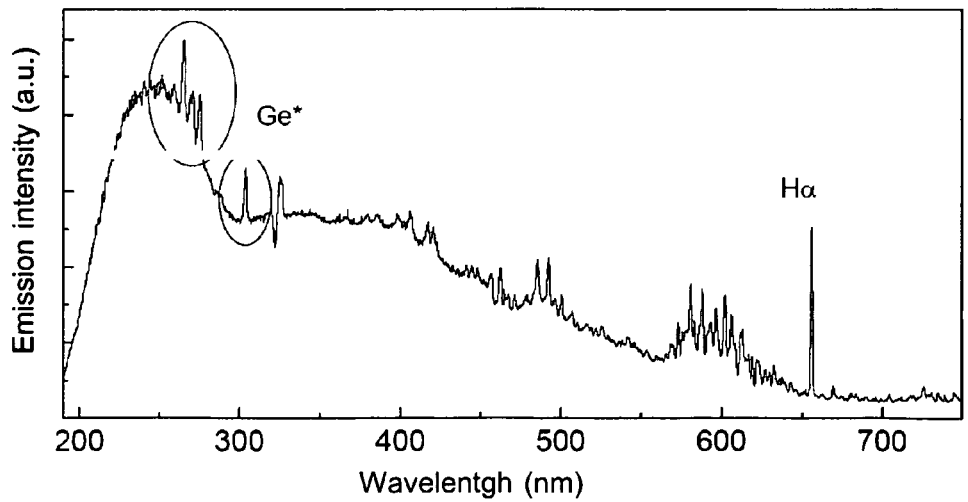
FIG. 32 shows an emission spectrum of the plasma generated.

FIG. 32 is an emission spectrum of the plasma generated in the present example. Emissions originating from germanium are observed at around wavelengths of 265, 269, 271, 275 and 304 nm. An emission from atomic hydrogen $H_\alpha$ is also found at 656 nm. Thus, it has been proven that germanium can be supplied into the plasma, similar to the case where silicon was used as the target.

Next, a germanium film was created on a substrate made of silicon (001). The deposition conditions were as follows: the hydrogen pressure was 26.6 kPa (200 Torr), the power supply was 600 W, the target-substrate distance was 1000 μm, and the substrate temperature was varied from 400° to 700° C.

Figure 33:
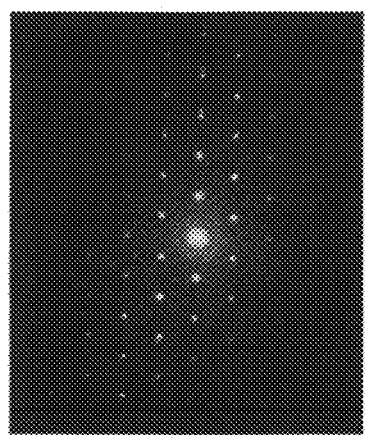
FIG. 33 is an transmission electron diffraction (TED) pattern of a germanium film created on a silicon substrate.
Figure 34:
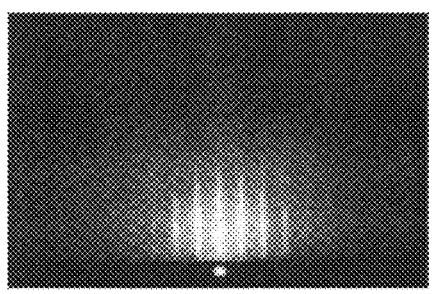
FIG. 34 is an RED image of a germanium film created on a silicon substrate at a temperature of 600° C.

FIG. 33 shows a transmission electron diffraction (TED) pattern of a created film. This image shows that the diffraction spots originating from silicon are accompanied by sub-spots located at approximately the same positions. Those sub-spots originate from a germanium crystal, whose lattice spacing differs from that of the silicon crystal. Thus, it has been proven that a germanium film has been heteroepiaxially grown on the silicon substrate. Also, the RED image in FIG. 34 shows a streak-like diffraction pattern, indicating that the surface is flat at the levels of electron diffraction.

(Substrate Temperature)

Figure 35:
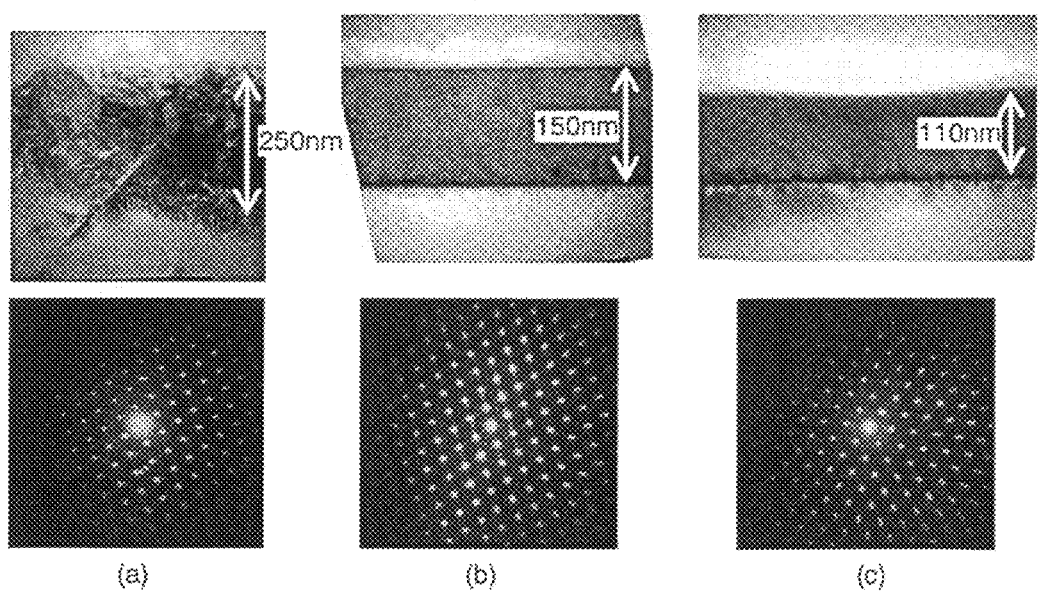
FIG. 35 shows TEM images (above) and TED images (below) of germanium films formed on silicon substrates at substrate temperatures of (a) 400° C., (b) 500° C. and (c) 700° C., respectively.

FIG. 35 shows TEM images (above) and TED images (below) of germanium films formed on silicon substrates at substrate temperatures of (a) 400° C., (b) 500° C. and (c) 700° C., respectively. At a temperature of 400° C., the silicon substrate was etched by hydrogen plasma at an initial stage of the deposition process before germanium atoms adhered to the surface of the substrate. As a result, the surface geometry of the substrate surface was significantly degraded. However, the TED image shows spots originating from germanium at positions slightly displaced from the silicon spots, similar to the previous case at 600° C. This proves that the germanium film epitaxially grows on the substrate even at a substrate temperature of 400° C. Setting the substrate temperature at 500° C. and 700° C. significantly suppressed the initial etching of the silicon substrate and thereby alleviated the degradation of the surface geometry of the substrate surface. Accordingly, the film surfaces shown in the TEM images are relatively smooth. The TED images show that those germanium films have made heteroepitaxial growth on the silicon. The thickness of each of those heteroepiaxially grown germanium films was equal to or larger than 100 nm, exceeding the critical thickness for strain relaxation. Thus, it has been found that the heteroepitaxial germanium films obtained in the present example were all strain-relaxed. This is also clear from the fact that the sub-spots of germanium are radially distributed on the TED images.

(AFM Images)

Figure 36:
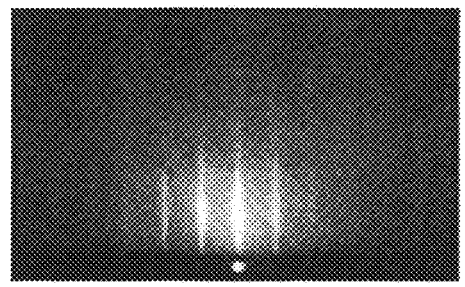
FIG. 36 is an RED pattern observed under the conditions (b) and (c) in FIG. 35.
Figure 37:
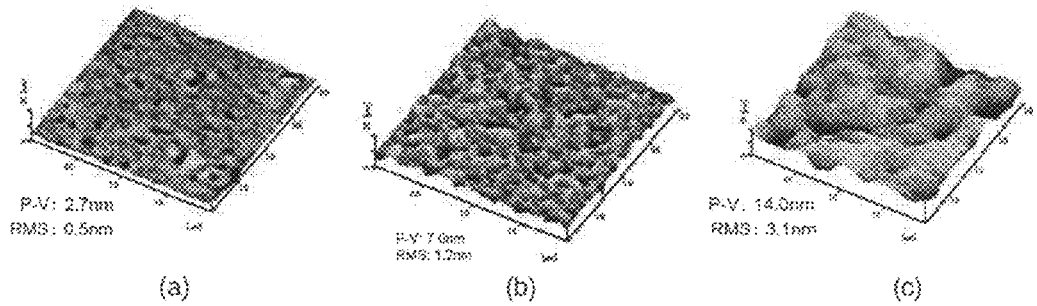
FIG. 37 shows surface AFM images of germanium films created at substrate temperatures of (a) 500° C., (b) 600° C. and (c) 700° C., respectively.

A refection electron diffraction (RED) measurement of the films created in the present example resulted in a streak-like pattern for every film, as shown in FIG. 36, except for the one created at 400° C. This means that their surface is substantially flat at the levels of electron diffraction. FIG. 37 shows AFM (atomic force microscope) images of the surfaces of the germanium films created at substrate temperatures of (a) 500° C., (b) 600° C. and (c) 700° C., respectively. FIG. 37 shows that, as the substrate temperature is lower, the surface roughness in terms of peak-to-valley (PV) and root-mean-square (RMS) values will be smaller.

It is known that the growth of germanium film on a silicon substrate generally includes the formation of germanium layers up to approximately three mono-layers, followed by island-like three-dimensional growth, during which the surface becomes significantly rough. One of the conventional techniques for suppressing the island-like three-dimensional growth and maintaining the two-dimensional growth of layers to obtain smooth surfaces is the surfactant growth, which utilizes hydrogen-terminated surfaces. In the present example, a hydrogen gas at approximately atmospheric pressure is used, so that the growing surface of the film is always easy to be hydrogen-terminated during the deposition process. The hydrogen-termination becomes more effective as the substrate temperature becomes lower. Therefore, it is most likely the formation of smoother germanium film surfaces at the lower substrate temperatures is due to the surfactant effect of hydrogen.

EXAMPLE 12

Figure 38:
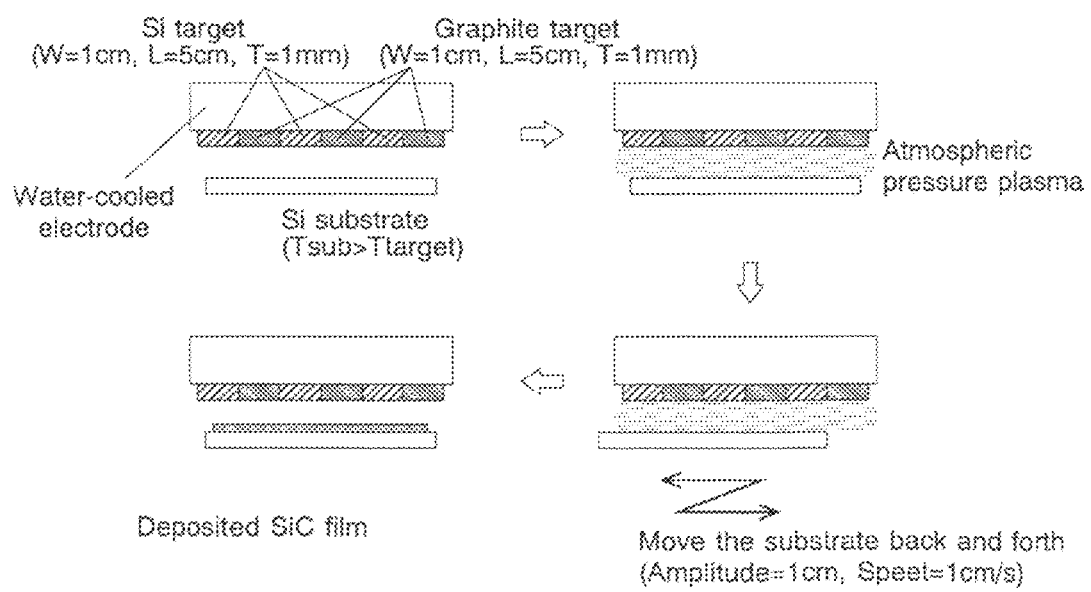
FIG. 38 is a flow chart of a process of fabricating a silicon carbide (SiC) film.

To show another example of the materials to which the present film producing method is applicable, a silicon carbide (SiC) film was created. The apparatus used and its operational conditions are substantially the same as those in Example 1. The substrate temperature was 600° C. The producing process is shown in FIG. 38.

Silicon targets and carbon targets, each measuring 1×1 cm, were alternately attached to the water-cooled electrode. In this case, both targets are simultaneously etched by hydrogen plasma, so that both silicon and carbon atoms are simultaneously present within the plasma. However, since the width of each target is 1 cm, the silicon atoms and carbon atoms can barely be mixed with each other within the plasma. Therefore, it is expected that a silicon-rich film will be created under each silicon target, while a carbon-rich film will be created under each carbon target. This situation can be avoided by moving the substrate back and forth with a stroke equal to the width of each target, i.e. 1 cm, at time intervals of 1 second. This operation enables the creation of a homogeneous film of Si—C on the substrate.

Using a plurality of targets, it is also possible to form a multi-layer film on the substrate, with each layer made of a different material, by transferring the targets over an area larger than the plasma generation area and bringing the targets into the plasma one after another (or alternately). Even in this case, a mixture film will be created if each target is held within the plasma for a short period of time during which the target is etched by approximately one atomic layer.

Figure 39:
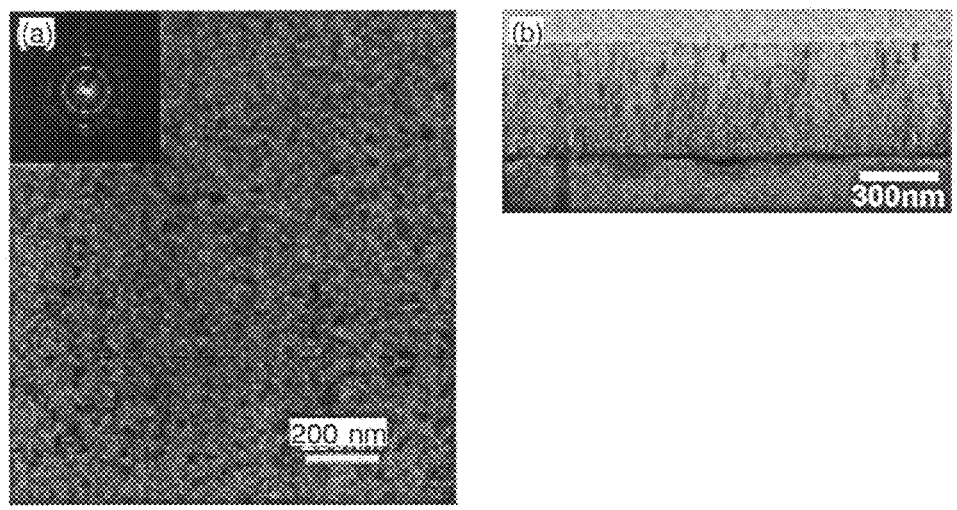
FIG. 39 shows (a) a surface TEM image and (b) a cross-sectional TEM image of the SiC film created.

FIG. 39(*a*) shows a surface TEM image of the created film, and FIG. 39(*b*) shows a cross-sectional TEM image of the same film. The surface TEM image shows that the created film was made of crystallites having grain sizes of approximately 20 nm. From the diffraction pattern included in FIG. 39(*a*), the film can be identified as a 3C—SiC polycrystalline film. The cross-sectional TEM image shows that the film thickness was approximately 400 nm and the deposition rate was 40 nm/min.

Figure 40:
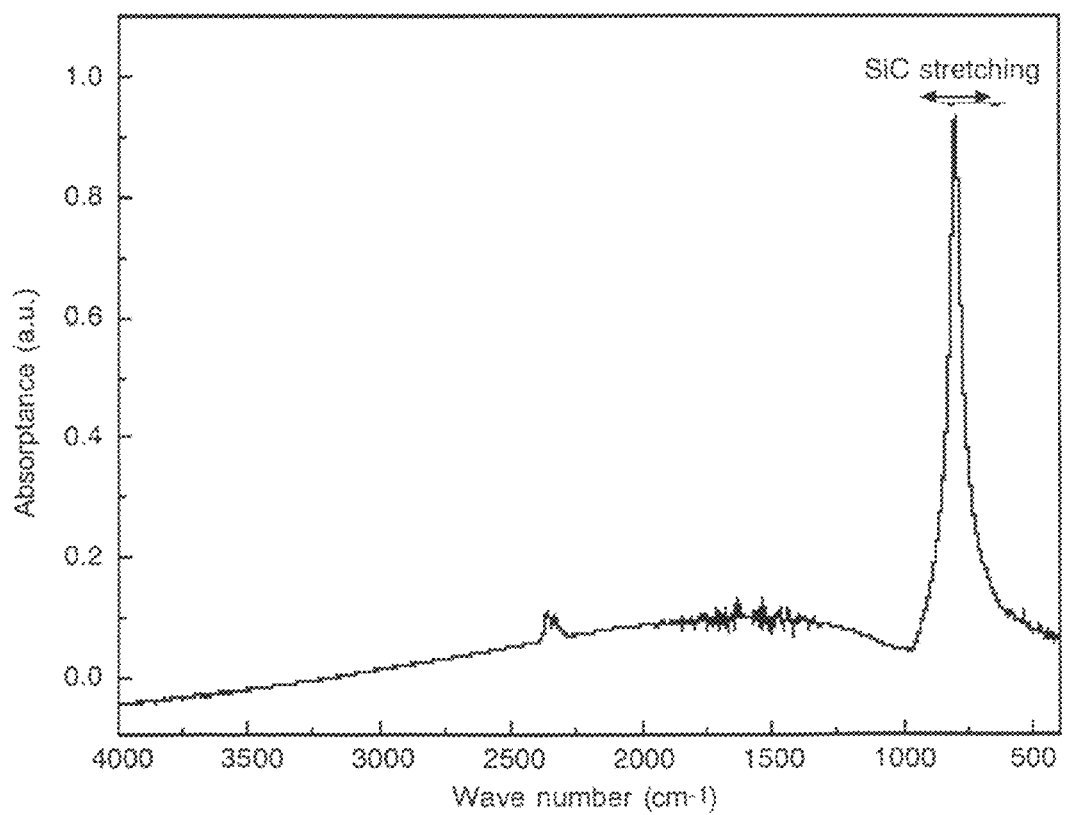
FIG. 40 shows an FTIR absorption spectrum of the SiC film created.

In FIG. 40, the clear peak spreading over a wave number range of 650 to 800 cm$^{-1}$ on the infrared absorption spectrum is attributable to a stretching vibration of the Si—C bond. Therefore, the crystallite substance can be identified as silicon carbide.

If an excessive amount of silicon exists at a specific portion of the film, that portion will be selectively eroded by KOH solution. Accordingly, the film produced in this example was immersed into a KOH solution and its surface was visually checked. There was no change to the surface before and after the immersing operation. Thus, the created film was proved to be a homogeneous crystallite film of SiC.

Figure 41:
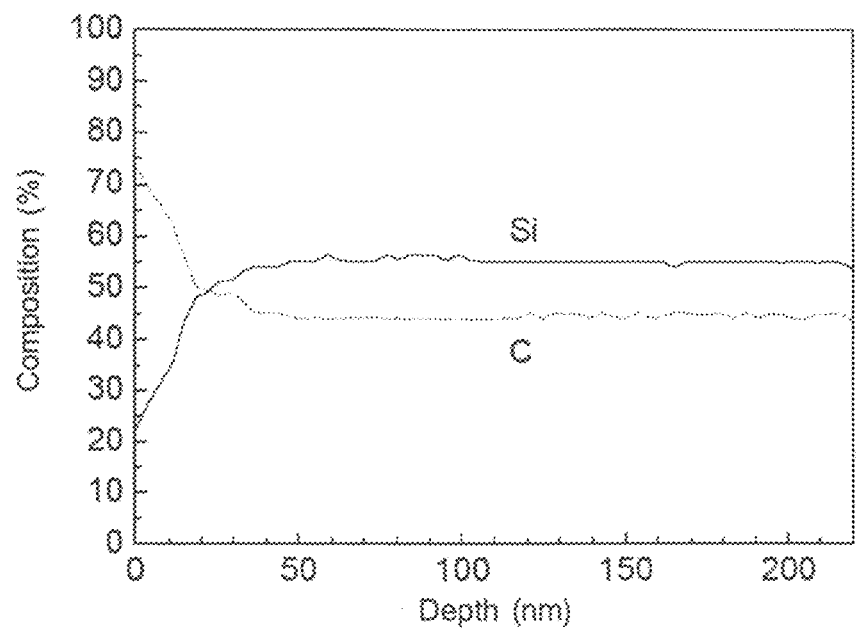
FIG. 41 is a graph showing the result of a measurement by Auger electron spectroscopy for investigating the thickness-directional composition of the created film.

FIG. 41 shows the result of an Auger electron spectroscopy measurement for investigating the thickness-directional composition of the created film. The figure shows that the periodical change of the target being positioned parallel to the substrate did not cause any unevenness in the thickness-directional composition of the film. The composition ratio of Si and C was approximately Si:C=55:45, which means that the SiC film created was a substantially stoichiometric film.

Figure 42:
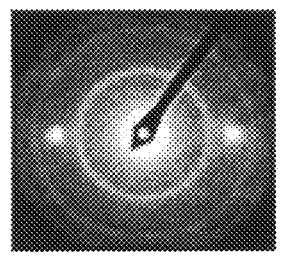
FIG. 42 is a transmission electron diffraction pattern of a SiC film created at 300° C. using graphite and silicon.

A transmission electron diffraction pattern of a film created on a silicon substrate at a substrate temperature of 300° C. by the same apparatus is shown in FIG. 42. The image shows a faint ring pattern in addition to the spots originating from the silicon substrate. From the radius of the ring, it was proved that the substance from which the ring was originated was 3C—SiC. This result confirms that crystallite 3C—SiC films can be formed also at a substrate temperature of 300° C.

EXAMPLE 13

(Creation of $Si_{1-x}Ge_x$ Film)

An experiment was carried out to determine whether an SiGe alloy, which is a complete solid solution, can be produced by the film producing method according to the present invention. As in the case of Example 12, silicon wafers and germanium wafers were arranged side by side as the targets, and a plasma was generated to form $Si_{1-x}Ge_x$ on a quartz substrate maintained at 600° C. It should be noted that the relative position of the substrate and the target was not changed in the present example.

Figure 43:
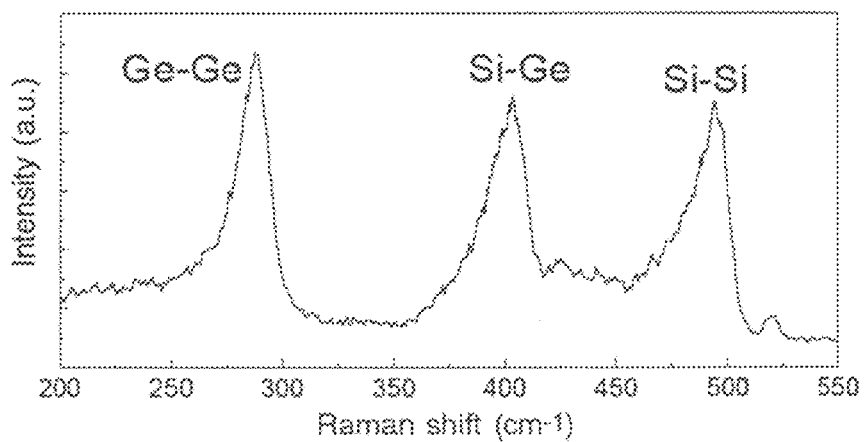
FIG. 43 is the Raman scattering spectrum from a SiGe film created on a quartz substrate.

The Raman scattering spectrum from the SiGe film created on the quartz substrate is shown in FIG. 43. The spectrum shows scattering peaks originating from Ge—Ge, Si—Si and Si—Ge bonds, demonstrating that a mixed crystal film of $Si_{1-x}Ge_x$ can be created.

Figure 44:
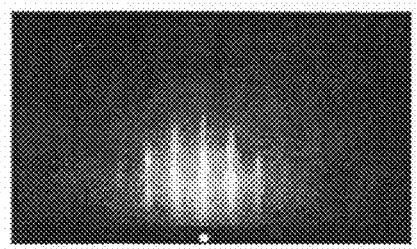
FIG. 44 is an RED image of an $Si_{1-x}Ge_x$ film created on a silicon substrate.

Next, a $Si_{1-x}Ge_x$ film was created by generating a plasma over an Si (001)-substrate maintained at 700° C. From its RED image (FIG. 44), it was proved that the resultant $Si_{1-x}Ge_x$ film was epitaxially grown on the silicon substrate. An Auger electron spectroscopy measurement showed that the film was composed of silicon and germanium with a mixed crystal ratio of Si:Ge=4:1. Thus, it has been demonstrated that a mixed crystal of $Si_{1-x}Ge_x$ can be created by arranging silicon and germanium side by side as the target materials. To improve the uniformity of the resulting film, it should be effective to relatively move the substrate and the target parallel to each other, as explained in Example 12.

EXAMPLE 14

(Formation of Sic Film Using Sintered Sic Material)

A deposition process was carried out using a sintered SiC wafer doped with nitrogen as the target. The apparatus used was substantially the same as used in Example 1. The experimental conditions were as follows: the hydrogen pressure was 26.6 kPa (200 Torr), the substrate temperature was 800° C., the power supply was 1000 W, the target-substance distance was 1000 μm, and the deposition time was 15 minutes.

Figure 45:
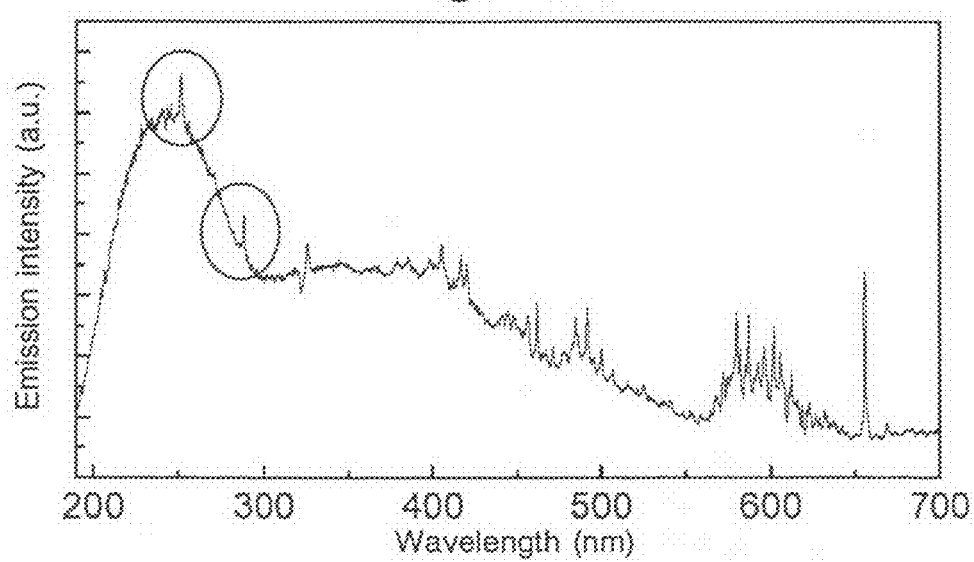
FIG. 45 shows a plasma emission spectrum observed during a deposition process using a sintered SiC target.

FIG. 45 is a plasma emission spectrum observed during the deposition process by the present example. The appearance of an emission peak originating from elementary silicon atoms suggests that both silicon and carbon atoms of the sintered SiC are each supplied into the plasma in an elementary form rather than in a mutually bonded form.

Figure 46:
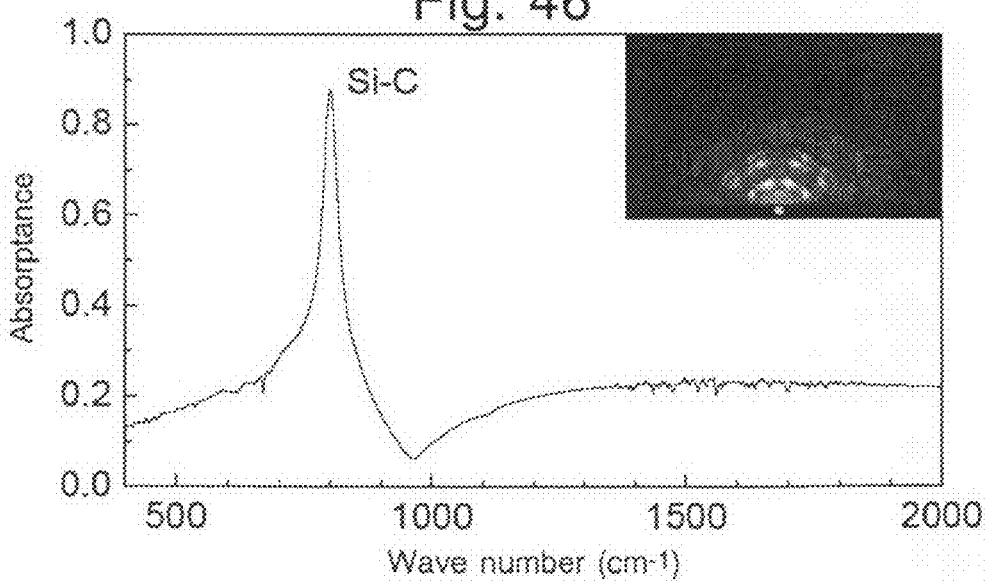
FIG. 46 show an infrared absorption spectrum and an RED image of the thin film created.

FIG. 46 shows an infrared absorption spectrum and an RED image of the film obtained. As in the previous case of using graphite and silicon, a sharp peak of Si—C bond appeared on the spectrum. From the radius of the ring observed in the RED image, the resultant film was identified as a polycrystalline 3C—SiC film. An Auger electron spectroscopy measurement showed that the composition ratio of silicon and carbon in the film created under the present conditions was 55:45, which means that the film was substantially stoichiometric. Thus, it has been proven that a SiC film can be formed also in the case where a sintered SiC is used as the target.

Figure 47:
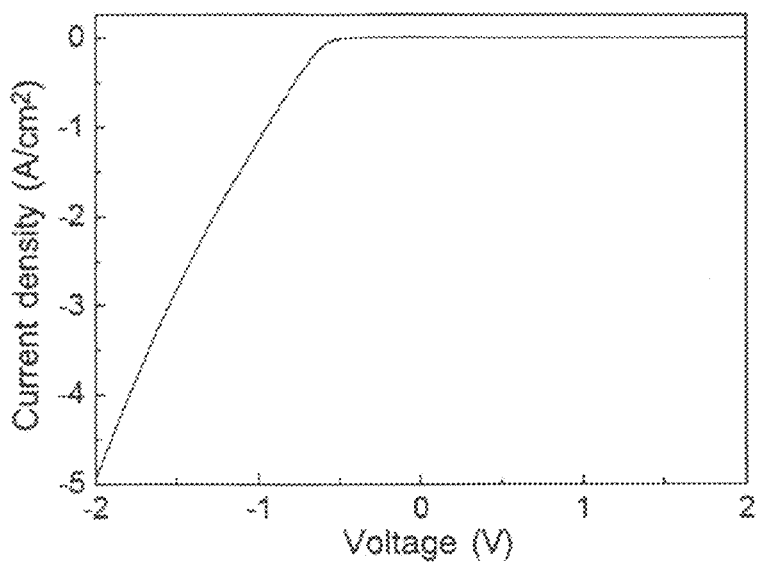
FIG. 47 shows the current-voltage characteristics of a p-n diode created.

The aforementioned sintered SiC is an n-type material pre-doped with nitrogen atoms. Taking this into account, an n-type 3C—SiC film was formed on a p-type silicon substrate to create a p-n diode at the interface between the film and substrate. FIG. 47 shows the current-voltage characteristics of the p-n diode created. The figure shows that the device obtained has a rectifying characteristic. Thus, it has been proven that SiC can also be doped by pre-mixing a dopant element into a solid target.

EXAMPLE 15

(Synthesis of Carbon Nanotubes)

A film was created on a silicon substrate on which fine particles of nickel were present, using substantially the same apparatus as used in Example 1 and setting only graphite as the target. The experimental conditions were as follows: the hydrogen pressure was 26.6 kPa (200 Torr), the substrate temperature was 600° C., the power supply was 1000 W, and the target-substance distance was 1000 μm.

Figure 48:
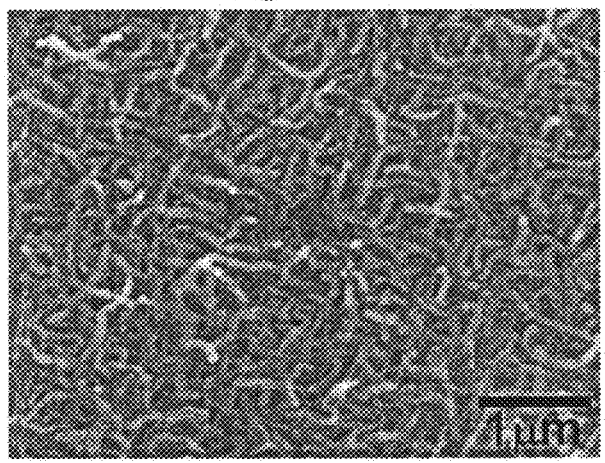
FIG. 48 is an electron microscope image of a carbon nanotube created using graphite as the target.

An electron microscope image is shown in FIG. 48. This image shows that carbon nanotubes having a tube diameter of approximately 100 nm were formed.

The following examples describe various experiments relating to the refined film producing method according to the present invention.

EXAMPLE 16

(Selectivity of Atmospheric Pressure Hydrogen Plasma)

Figure 49:
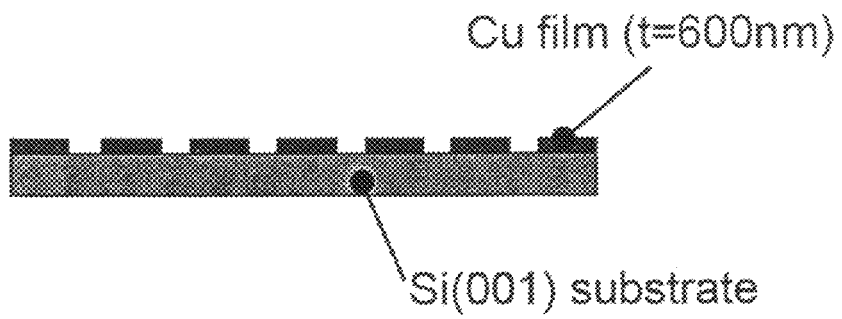
FIG. 49 is a model view of a sample created by depositing a copper film on a silicon substrate.
Figure 50:
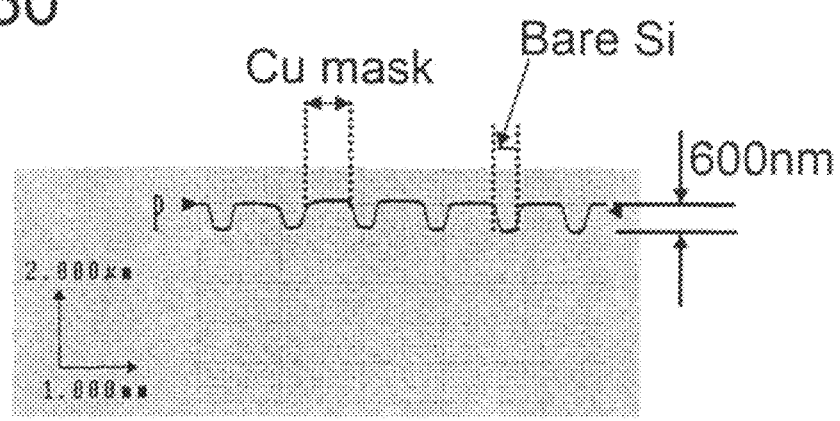
FIG. 50 is a graph showing a surface profile of the sample in FIG. 49 measured by a surface roughness tester having a stylus.
Figure 51:
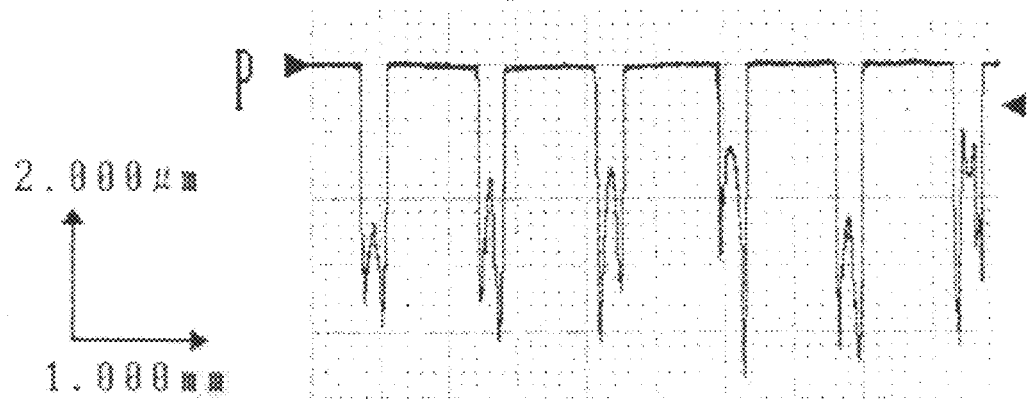
FIG. 51 is a graph showing the surface roughness of the sample in FIG. 49 after the sample was etched for 20 minutes.

To prove the element selectivity of the etching reaction of atmospheric pressure plasma, a copper film having a thickness of 600 nm was formed on a silicon substrate, as shown in FIG. 49. In the copper-depositing process, a mask was used to allow copper films to be formed on specific portions while leaving bare silicon on the other portions. The surface geometry at this moment was measured with a surface roughness tester having a stylus. The result is shown in FIG. 50. This figure shows that a copper film of 0.5 mm in width and 600 nm in thickness was formed on the silicon substrate. Using this sample, an etching process using atmospheric pressure hydrogen plasma was carried out for 20 minutes. The silicon substrate was set at room temperature during the etching. However, the temperature should passively increase due to the heat from the plasma during the etching. After the etching was completed, the copper film was removed from the surface of the silicon substrate with dilute sulfuric acid, and the surface geometry was measured again with the surface roughness tester. The result is shown in FIG. 51. This figure shows that the substrate was etched to depths of approximately 3 μm at the points where bare silicon was left, while the copper mask almost perfectly retained its original pattern even after the hydrogen etching. Since the copper mask was as thin as 600 nm, it can be clearly said that silicon is easier to be etched than copper. Thus, it has been proven that hydrogen plasma etching is an element-selective process.

EXAMPLE 17

Using an inner blade wire-saw, a 98% pure metallurgical grade silicon, which was produced and reduced in Brazil, was sliced into a square plate measuring 2 mm in thickness and 80 mm on a side, and this plate was used as the target. A cooling water at 20° C. was passed through the electrode at a flow rate of 2 l/min to cool the electrode. The apparatus used and its operational conditions in the present example are substantially the same as those in Example 1. A commercially available silicon (001)-wafer was used as the substrate and set on the heater. The substrate temperature was set at 400° C. The atmosphere inside the reaction chamber was a 100% hydrogen gas and its pressure was maintained between 26.6 and 101 kPa (200 and 760 Torr). To generate plasma, a very high frequency (VHF) power source operating at 150 MHz was used and a power of 1000 W was supplied from it. The back pressure of the reaction container was $5 \times 10^{-6}$ Pa. The target-substrate distance was 1 mm.

Figures 52, 53:
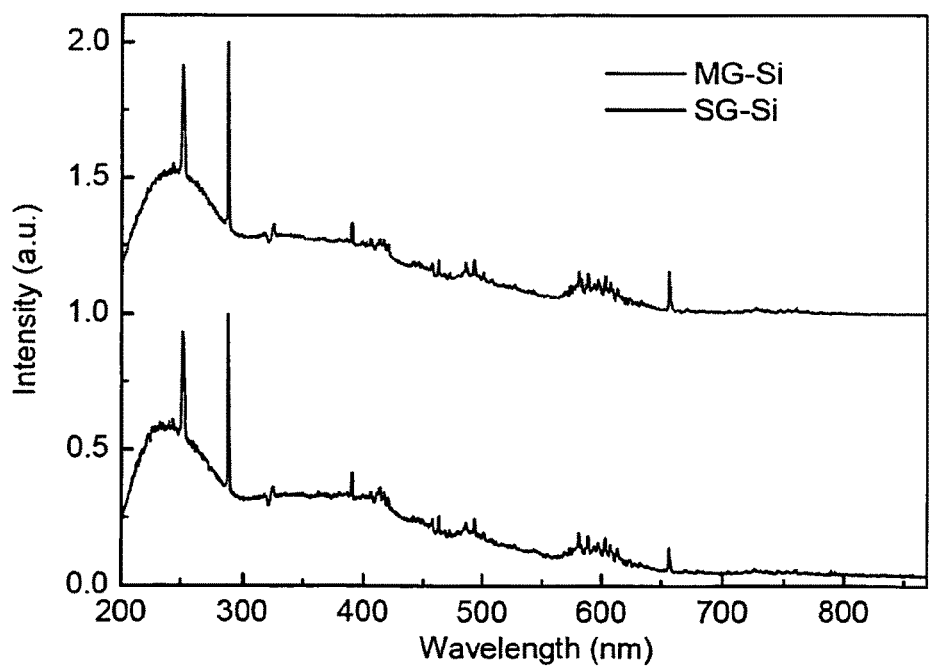
FIG. 52 is a table showing the concentrations of the impurities contained in a metallurgical grade silicon used.
FIG. 53 shows an emission spectrum of a hydrogen plasma generated using MG—Si as the target.

FIG. 52 is a table showing the concentrations of impurities in the metallurgical grade silicon used in the present example. The table also shows the generally reported impurity concentrations of metallurgical grade silicon and the purity levels required for solar-grade silicon.

(Atmospheric Pressure Hydrogen Plasma with Metallurgical Grade Silicon)

FIG. 53 shows an emission spectrum (MG—Si) of hydrogen plasma generated in the present example. In the figure, emissions from silicon atoms are observed in addition to the spectrum of the hydrogen gas used. By contrast, it shows no emission from iron (at 248, 272 and 344 nm), aluminum and other atoms that are abundantly found in the target. This spectrum looks similar to the other spectrum (SG-Si) observed when a single-crystalline silicon wafer for LSI is used as the target.

(TREX Analysis)

Figure 54:
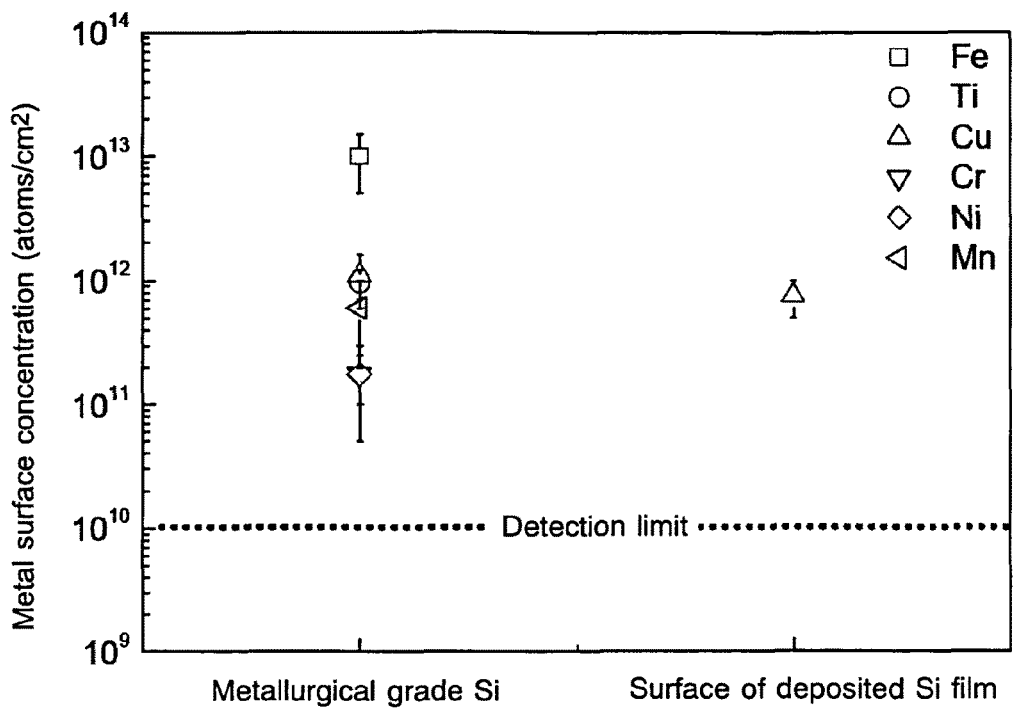
FIG. 54 is a graph showing the result of a TREX measurement of metal densities on the surface of the silicon film created.

The metal densities on the surface of the silicon film created in the present example were measured by total reflection X-ray (TREX) analysis. The result is shown in FIG. 54. For the purpose of reference, the graph in FIG. 54 also shows metal concentrations on the surface of the metallurgical grade silicon used. The error bars in FIG. 54 each indicate the deviation of measured values at 27 points at which metals were detected among the 33 measurement points. It should be noted that aluminum was excluded from evaluation because its characteristic X-rays peak would appear in the vicinity of that of silicon and deteriorate the reliability of quantitative determination. The measurement focused on the following metal elements: Fe, Ti, Cu, Cr, Ni and Mn. As is clear from FIG. 54, those elements were present on the initial metallurgical grade silicon with the following concentrations: $Fe=10^{13}$, $Ti=10^{12}$, $Cu=10^{13}$, $Cr=2\times10^{11}$, $Ni=2\times10^{11}$, and $Mn=6\times10^{11}$ atoms/cm$^2$. By contrast, the concentrations of those elements on the surface of the created silicon film were reduced to below the detection limit of the TREX analysis, with the exception of Cu. A possible reason for the rather small reduction of Cu concentration is because the member for holding the target was made of Cu.

Figure 55:
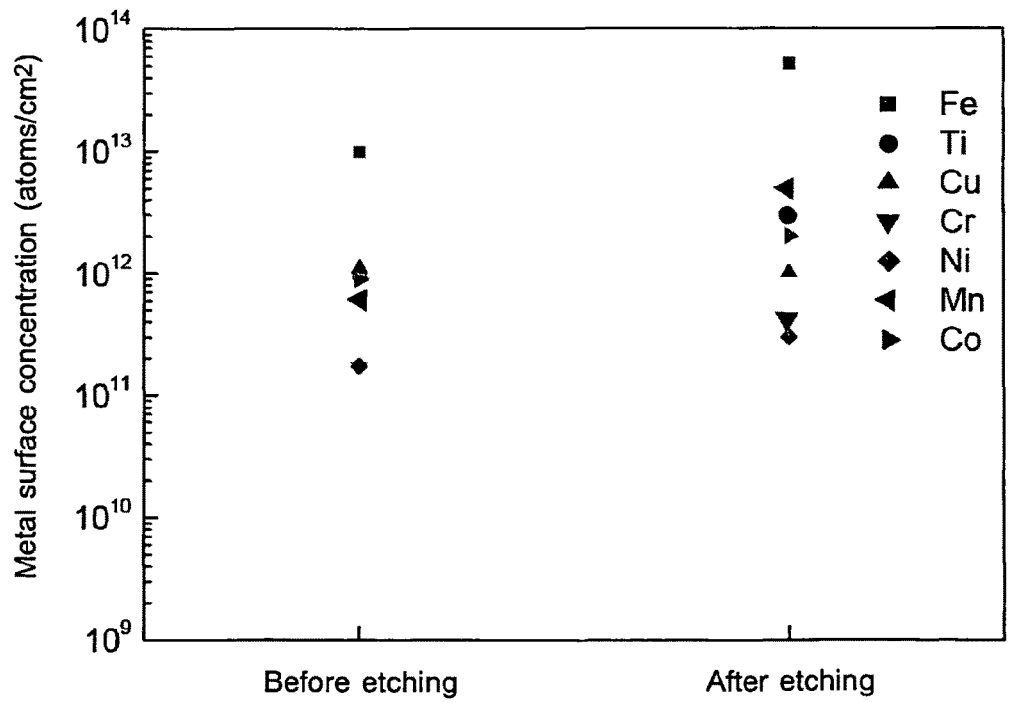
FIG. 55 is a graph showing the metal concentrations on the surface of the target (metallurgical grade silicon) after the etching.

Next, the metal concentrations on the surface of the target (i.e. metallurgical grade silicon) after the etching were measured by total reflection X-ray (TREX) analysis. The result is shown in FIG. 55. As shown in this figure, the surface concentration of any of those metal elements increased to a value approximately two to five times the original value. This suggests that the metal impurities in the metallurgical grade silicon will be left on the target surface and condensed as a result of the etching by atmospheric pressure plasma. To investigate how this condensation of metal impurities on the target surface would affect the etching rate, the etching rate of the target after 15 minutes from the beginning of the etching was compared with that of the same target after 40 minutes. The difference between the two values was minor: within a range of ±5%.

(Analysis of Impurities by ICP-MS)

Figure 56:
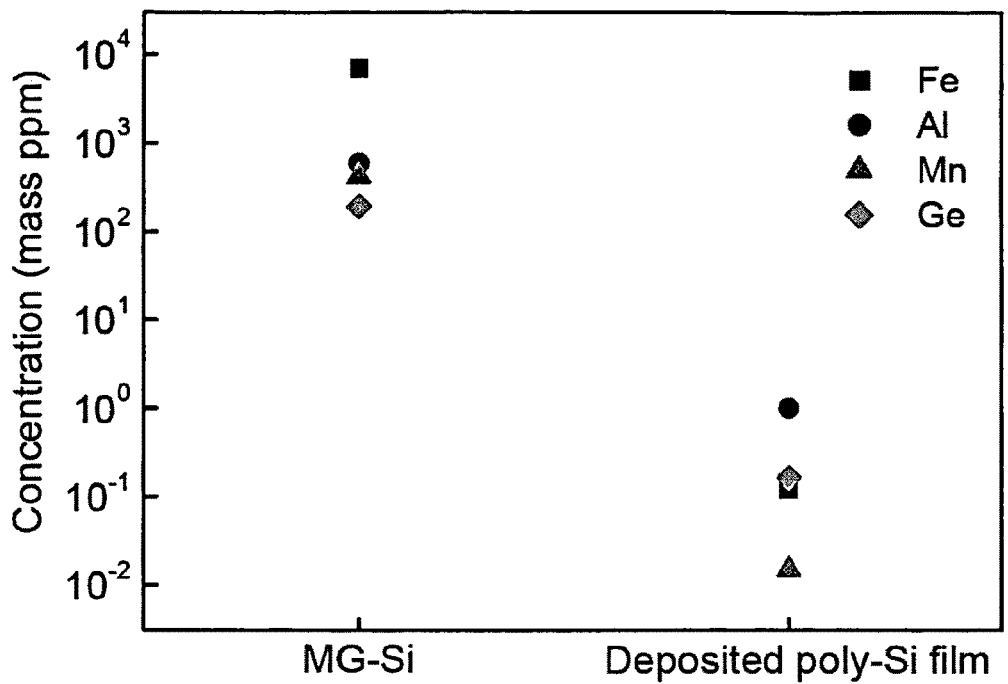
FIG. 56 is a graph showing the contents of iron (Fe), aluminum (Al), manganese (Mn) and germanium (Ge) within the metallurgical grade silicon, and those of the same elements within a silicon film created.
Figure 57:
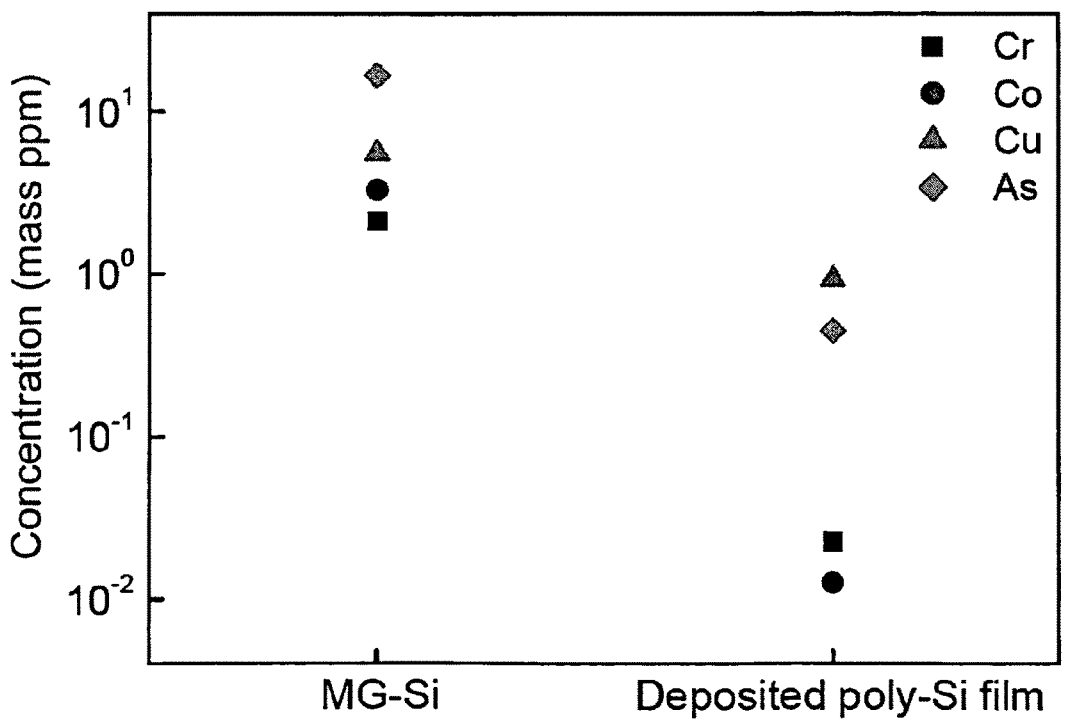
FIG. 57 is a graph showing the contents of chromium (Cr), cobalt (Co), copper (Cu) and arsenic (As) within the metallurgical grade silicon, and those of the same elements within a silicon film created.

For a more precise quantitative determination of the impurities present in the silicon target, the impurity concentrations were measured by inductively coupled plasma mass spectrometry (ICP-MS). The sample was a silicon film of approximately 40 μm in thickness, which was created under the same conditions as in Example 16. The result is shown in FIGS. 56 and 57. FIG. 56 shows that the concentrations of Fe, Al and Mn within the silicon film created were significantly decreased to $1/10^5$, $1/10^3$ and $1/10^4$ of the original values, respectively. For Ge, which can be hydrogenated as $GeH_4$, the concentration within the film was also decreased to a level lower than 1/100 of the original value. FIG. 57 proves that the impurity concentrations of Co and Cr within the film can also be reduced to a level lower than 1/100 of the original value.

As in the previously explained TREX analysis, the decrease of Cu concentration was rather small, most likely because of the same reason as explained earlier. For a solar cell using p-type silicon, it is said that containing 2.5 ppm mass or more of Cu as an impurity will negatively affect the conversion efficiency. The Cu content of the silicon film created in the present example was 1 ppm mass. Accordingly, the film can be used in solar cells without any problem.

Arsenic is known as an n-type dopant for silicon. It can form a hydride called arsine ($AsH_3$) and exhibits a large segregation coefficient when contained in silicon. Despite these characteristics, arsenic concentration in the silicon film created was as low as approximately 1/100 of the original value.

Thus, even germanium, arsenic and other elements that can form a hydride, have exhibited reductions in the amounts of mixtures in the resultant silicon film. Most likely, this is because the activation energy and reaction frequency factor of those elements (Ge, As and Si) differ from those of hydrogen atoms in the etching and deposition phenomena, as shown in FIG. 6.

In the present invention, it is also possible to intentionally remove silicon from a mixed-crystal material of SiGe. This suggests that the present invention is applicable to the technique of producing distorted SiGe, in which a distorted SiGe layer with a high Ge concentration is created from a SiGe material with a low Ge concentration.

Thus, the film producing method and the refined film producing method according to the present invention have been described with reference to the examples. It is clear that the previous examples are merely illustrative ones and can be improved or changed according to necessity within the spirit of the present invention.

For example, the target may be a powder or similar material. For the purpose of purifying an objective substance, it is not necessary for the target to be mass or plate shaped. Using a powder or similar material will increase the contact surface with plasma and enhance the reaction rate.

Figure 58:
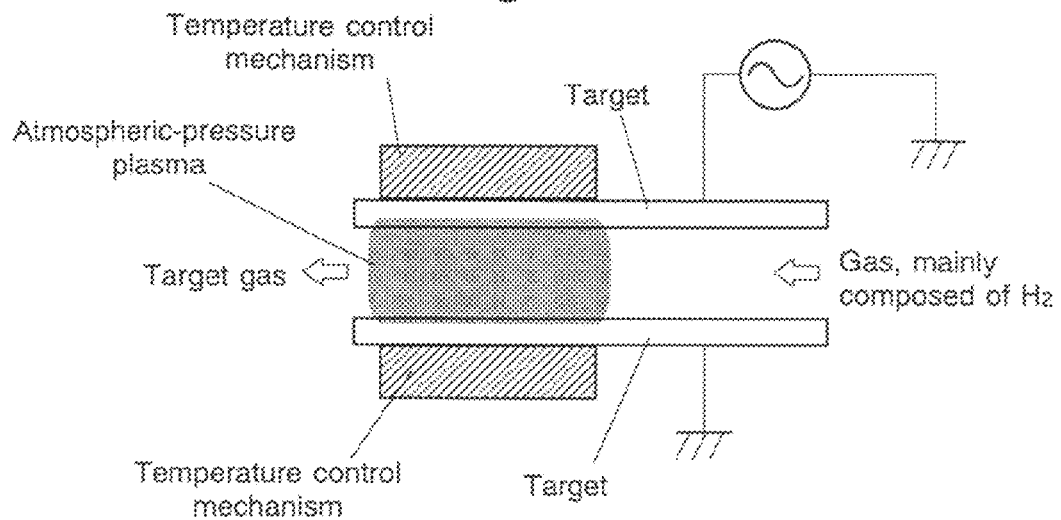
FIG. 58 is a conceptual diagram showing the configuration of the main section of a system for producing a target gas.

The film producing method according to the present invention may be used to produce a gas of the target material instead of forming a film of that material. This can be achieved by filling the reaction chamber with a reactant gas mainly composed of hydrogen at a pressure of 10 to 202 kPa (76 to 1520 Torr), arranging a pair of targets, whose hydride is volatile, parallel to each other within the reaction chamber, and generating an electric discharge between the targets. FIG. 58 is a conceptual diagram showing the configuration of the main section of the present system. To produce a largest possible amount of gas, the temperature regulation mechanism should be operated so that both upper and lower targets (the words "upper" and "lower" are used here merely for the convenience of reference) will be maintained at the same temperature that gives the maximum etching rate according to the temperature-etching rate characteristics of the target material.

For an efficient extraction of the produced gas, it is preferable to produce a flow of the reactant gas mainly composed of hydrogen in a predetermined direction at a constant flow rate, as shown in FIG. 58.

The target gas obtained by the previous method can be used as a material gas for film production. Another advantage of the target gas produced by the present method exists in that it can be mixed with another gas prior to the deposition process. Examples of such additional gases used for silicon compounds include $N_2$ (for the production of silicon nitride films) and $H_2O$ (for the production of silicon oxide films).

From the viewpoints of industrial applications, use of a target mainly composed of silicon or germanium is preferable. The reactant gas may be a mixed gas prepared by adding a rare gas to the hydrogen gas.

Figure 59:
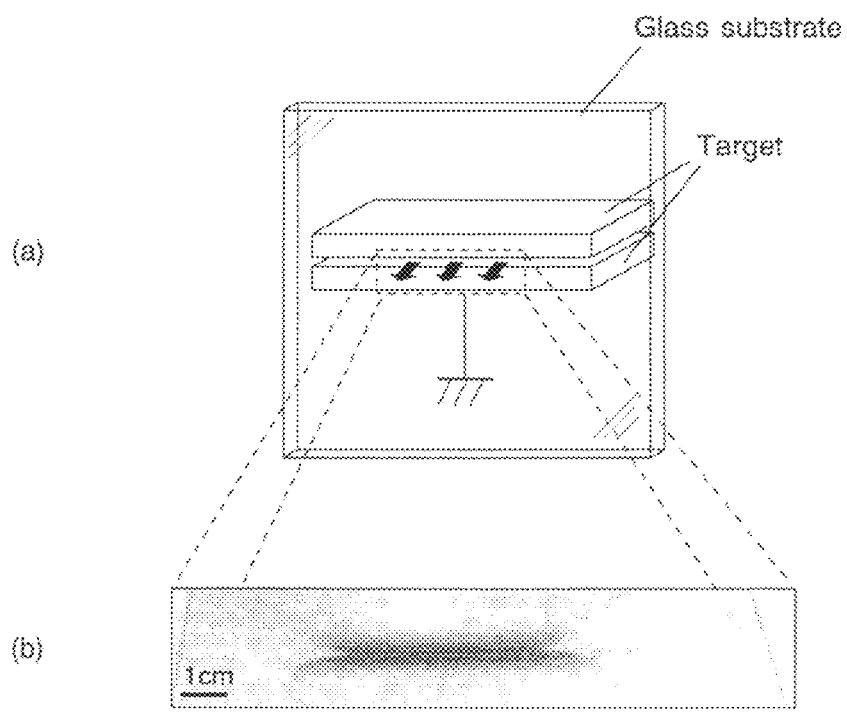
FIG. 59($a$) is a schematic view of a system used in a film deposition experiment by a target-gas production method, and FIG. 59($b$) shows a silicon film formed on a glass substrate.

To prove the practical applicability of the previous target gas production method, the inventors have carried out an experiment using a system constructed as shown in FIG. 58. The targets were made of silicon and maintained at room temperature. As shown in FIG. 59(*a*), a glass substrate was vertically held at a distance of 2 to 3 mm from the nozzle (gas outlet) of the system. A mixed gas of hydrogen gas (10 l/min) and helium gas (10 l/min) was supplied as the reactant gas, and a plasma was generated to produce the target gas. This gas was discharged from the nozzle onto the (unheated) glass substrate for approximately one minute. As a result, a silicon film of approximately 100 nm in thickness was formed on the substrate, as shown in FIG. 59(*b*). The formation of this film is attributable to the action of radicals contributing to film-forming which originate from $SiH_x$ (x=0, 1, 2 or 3) generated within the plasma and reach the substrate. The etched depth of the target was approximately 300 nm. The deposition area was as small as 5.5 cm$^2$, whereas the etched area was approximately 12 cm$^2$. From the relationship between the total amount of the etched material and that of the deposition, it has been confirmed that some kinds of silicon hydride (e.g. $SiH_4$ or $Si_2H_6$) that do not contribute to the film formation have been produced.

It is also possible to obtain a refined gas by the previous target gas production method. In this case, the target is set within a reaction chamber filled with a reactant gas mainly composed of hydrogen at a pressure of 10 to 202 kPa (76 to 1520 Torr). Then, with reference to the temperature-etching rate characteristics of each substance contained in the target, the temperature of the target is controlled so that the etching rate of the objective substance will be higher than that of any other non-objective substance. Under this state, a refined gas mainly composed of the objective substance can be obtained by generating an electric discharge within the reaction chamber.

The invention claimed is:

1. A film producing method, comprising:
arranging a substrate and a target parallel to each other within a reaction chamber filled with a reactant gas mainly composed of hydrogen at a pressure of 10 to 202 kPa (76 to 1520 Torr), the target being made of a substance whose hydride is volatile, the substrate is maintained at a higher temperature than the target; and
generating an electric discharge between the substrate and the target to form a thin film of the target on the substrate.

2. The film producing method according to claim 1, wherein the target is mainly composed of either Si or Ge.

3. The film producing method according to claim 1, wherein a doping element is mixed into the target beforehand to obtain a doped film.

4. The film producing method according to claim 1, wherein the target is mainly composed of one of the following substances: C, SiC, Sn, Ga, B, P, Sb and As.

5. A film producing method, comprising:
arranging a substrate and a plurality of targets substantially parallel to each other within a reaction chamber filled with a reactant gas mainly composed of hydrogen at a pressure of 10 to 202 kPa (76 to 1520 Torr), the substrate is maintained at a higher temperature than the target;

generating an electric discharge between the substrate and the target; and moving the plurality of targets, parallel to the substrate, within a region of the electric discharge to form a mixed film of the plurality of targets on the substrate.

6. The film producing method according to claim 5, wherein the plurality of the targets include a Si target and a C target.

7. A film producing method, comprising:

arranging a substrate and a plurality of targets substantially parallel to each other within a reaction chamber filled with a reactant gas mainly composed of hydrogen at a pressure of 10 to 202 kPa (76 to 1520 Torr), the substrate is maintained at a higher temperature than the target;

generating an electric discharge between the substrate and the target; and moving the plurality of targets, parallel to the substrate, with a stroke over a region of the electric discharge to form a laminated or mixed film of the plurality of targets on the substrate.

8. The film producing method according to claim 1, wherein the reactant gas mainly composed of hydrogen is a mixed gas prepared by adding a rare gas to a hydrogen gas having a pressure of 10 to 202 kPa (76 to 1520 Torr).

9. A film producing apparatus, comprising:

a reaction chamber that can be tightly sealed;

a target holder and a substrate holder, both being located within the reaction chamber, a temperature of each holder being independently controllable;

a reactant gas supplier for supplying a reactant gas mainly composed of hydrogen into the reaction chamber at a predetermined pressure;

a plasma generator for generating a plasma between a target held by the target holder and a substrate held by the substrate holder; and a controller for supplying the reactant gas mainly composed of hydrogen into the reaction chamber until a pressure of 10 to 202 kPa (76 to 1520 Torr) is reached, for maintaining the target holder at a temperature lower than that of the substrate while maintaining the substrate holder at a temperature higher than that of the target, and for a control system to generate a plasma of the reactant gas mainly composed of hydrogen between the target and the substrate.

10. The film producing apparatus according to claim 9, further comprising a moving system for relatively moving the target holder and the substrate holder parallel to each other.

11. The film producing apparatus according to claim 9, wherein the reactant gas mainly composed of hydrogen is a mixed gas prepared by adding a rare gas to a hydrogen gas having a pressure of 10 to 202 kPa (76 to 1520 Torr).

12. A refined film producing method for purifying and extracting an objective substance from a target containing the objective substance and one or more non-objective substances, the target being made of a substance whose hydride is volatile, comprising:

arranging a substrate and the target parallel to each other within a reaction chamber filled with a reactant gas mainly composed of hydrogen at a pressure of 10 to 202 kPa (76 to 1520 Torr);

controlling a temperature of the substrate and that of the target taking into account a temperature-etching rate characteristic of each substance contained in the target so that an etching rate of the objective substance at the temperature of the target is higher than that at the temperature of the substrate, while an etching rate of each of the non-objective substances at the temperature of the substrate is higher than that at the temperature of the target, or while the etching rate of each of the non-objective substances at the temperature of the target is lower than the etching rate of the objective substance at the temperature of the target; and generating an electric discharge between the substrate and the target to form a thin film of the objective substance on the substrate.

13. The refined film producing method according to claim 12, characterized in that a purity of the objective substance is improved by using the thin film formed by the method described in claim 12 as a new target and forming a new film on the substrate again by the same method.

14. The film producing apparatus according to claim 9, wherein each of the target holder and the substrate holder is provided with a heating/cooling mechanism.

15. A target gas production method, comprising:

arranging a pair of targets, whose hydride is volatile, parallel to each other within a reaction chamber filled with a reactant gas mainly composed of hydrogen at a pressure of 10 to 202 kPa (76 to 1520 Torr); and generating an electric discharge between the targets to produce a gas of the target.

16. The target gas production method according to claim 15, wherein the target is mainly composed of either Si or Ge.

17. The target gas production method according to claim 15, wherein the reactant gas mainly composed of hydrogen is a mixed gas prepared by adding a rare gas to a hydrogen gas having a pressure of 10 to 202 kPa (76 to 1520 Torr).

18. A refined gas producing method for purifying and extracting an objective substance from a target containing the objective substance and one or more non-objective substances, the target being made of a substance whose hydride is volatile, comprising:

arranging the target within a reaction chamber filled with a reactant gas mainly composed of hydrogen at a pressure of 10 to 202 kPa (76 to 1520 Torr);

controlling a temperature of the target taking into account a temperature-etching rate characteristic of each substance contained in the target so that an etching rate of the objective substance is higher than an etching rate of any of the non-objective substances; and generating an electric discharge within the reaction chamber to produce a refined gas mainly composed of the objective substance.

19. The film producing method according to claim 5, wherein the reactant gas mainly composed of hydrogen is a mixed gas prepared by adding a rare gas to a hydrogen gas having a pressure of 10 to 202 kPa (76 to 1520 Torr).

20. The film producing method according to claim 7, wherein the reactant gas mainly composed of hydrogen is a mixed gas prepared by adding a rare gas to a hydrogen gas having a pressure of 10 to 202 kPa (76 to 1520 Torr).

* * * * *